(12) United States Patent
Huang et al.

(10) Patent No.: US 10,741,496 B2
(45) Date of Patent: Aug. 11, 2020

(54) SEMICONDUCTOR DEVICES WITH A PROTECTION LAYER AND METHODS OF FABRICATION

(71) Applicant: NXP USA, Inc., Austin, TX (US)

(72) Inventors: Jenn Hwa Huang, Chandler, AZ (US); James Allen Teplik, Mesa, AZ (US); Darrell Glenn Hill, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/209,752

(22) Filed: Dec. 4, 2018

(65) Prior Publication Data
US 2020/0176389 A1    Jun. 4, 2020

(51) Int. Cl.
| | |
|---|---|
| *H01L 29/66* | (2006.01) |
| *H01L 23/532* | (2006.01) |
| *H01L 29/778* | (2006.01) |
| *H01L 21/762* | (2006.01) |
| *H01L 29/417* | (2006.01) |
| *H01L 29/423* | (2006.01) |
| *H01L 29/20* | (2006.01) |

(52) U.S. Cl.
CPC ...... *H01L 23/53295* (2013.01); *H01L 21/762* (2013.01); *H01L 29/2003* (2013.01); *H01L 29/41725* (2013.01); *H01L 29/42316* (2013.01); *H01L 29/66462* (2013.01); *H01L 29/7786* (2013.01); *H01L 29/66431* (2013.01); *H01L 29/7781* (2013.01); *H01L 29/7787* (2013.01)

(58) Field of Classification Search
None
See application file for complete search history.

(56) References Cited

U.S. PATENT DOCUMENTS

| | | | |
|---|---|---|---|
| 7,045,404 B2 | 5/2006 | Sheppard et al. | |
| 7,709,269 B2 | 5/2010 | Smith et al. | |
| 7,750,370 B2 | 7/2010 | Smorchkova et al. | |
| 8,193,591 B2 | 6/2012 | Green et al. | |
| 9,425,301 B2 * | 8/2016 | Chiu | H01L 23/291 |

* cited by examiner

*Primary Examiner* — Minh Loan Tran
(74) *Attorney, Agent, or Firm* — Bruce M. Green

(57) ABSTRACT

An embodiment of a semiconductor device includes a semiconductor substrate, a first dielectric layer disposed over a semiconductor substrate, a source electrode and a drain electrode formed over the semiconductor substrate within openings formed in the first dielectric layer, a gate electrode formed over the semiconductor substrate between the source electrode and the drain electrode, and a protection layer disposed on the source electrode, the drain electrode, and the first dielectric layer, wherein a first edge of the protection layer terminates the protection layer between the source electrode and the gate electrode, and a second edge of the protection layer terminates the protection layer between the gate electrode and the drain electrode. A method for fabricating the semiconductor devices includes forming a first dielectric layer over the semiconductor substrate, forming source and drain electrodes, depositing the protection layer over the source and drain electrodes, and forming the gate electrode.

21 Claims, 13 Drawing Sheets

SEMICONDUCTOR DEVICES WITH A PROTECTION LAYER AND METHODS OF FABRICATION

TECHNICAL FIELD

Embodiments of the subject matter described herein relate generally to semiconductor devices with a protection layer and methods for fabricating such devices.

BACKGROUND

Semiconductor devices find application in a wide variety of electronic components and systems. High power, high frequency transistors find application in radio frequency (RF) systems and power electronics systems. Gallium nitride (GaN) device technology is particularly suited for these RF power and power electronics applications due to its superior electronic and thermal characteristics. In particular, the high electron velocity and high breakdown field strength of GaN make devices fabricated from this material ideal for RF power amplifiers and high-power switching applications. Accordingly, there is a need for semiconductor and, in particular, GaN devices with manufacturable, high reliability features as well as methods for making such semiconductor devices. In some device processes, process chemistries may attack and/or erode metals used to realize the ohmic contacts and other device features. Thus, there is a need for semiconductor device structures and processes that protect metals (e.g. ohmic contacts used to form source/drain electrodes) sensitive to chemical exposure from process chemicals that may etch these metals.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

Figure 1:
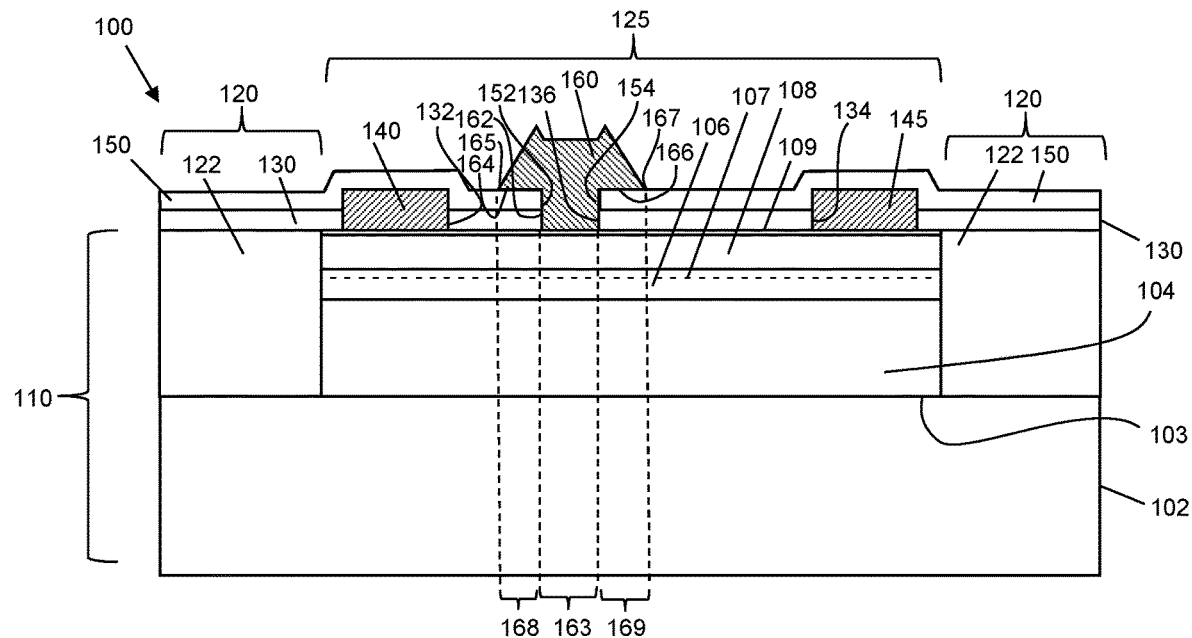
FIG. 1 is a cross-sectional, side view of an exemplary GaN heterojunction field effect transistor (HFET) in accordance with an embodiment.

FIG. 1 is a cross-sectional, side view of an exemplary GaN heterojunction field effect transistor (HFET) device 100 in accordance with an embodiment. In an embodiment, the GaN HFET device 100 may include a semiconductor substrate 110, one or more isolation regions 120, an active region 125, a first dielectric layer 130, a source electrode 140, a drain electrode 145, a second dielectric layer 150 ("protection layer"), and a gate electrode 160. As is described more fully below, the GaN HFET device 100 is substantially contained within the active region 125 defined by the isolation regions 120, with the first dielectric layer 130, the source electrode 140, drain electrode 145, and gate electrode 160 are disposed over the semiconductor substrate 110.

In an embodiment, the semiconductor substrate 110 may include a host substrate 102, a buffer layer 104 disposed over the host substrate 102, a channel layer 106 disposed over the buffer layer 104, a barrier layer 108 disposed over the channel layer 106, and a cap layer 109 disposed over the channel layer 106. In an embodiment, the host substrate 102 may include silicon carbide (SiC). In other embodiments, the host substrate 102 may include other materials such as sapphire, silicon (Si), GaN, aluminum nitride (AlN), diamond, poly-SiC, silicon on insulator, gallium arsenide (GaAs), indium phosphide (InP), and other substantially insulating or high resistivity materials. A nucleation layer (not shown) may be formed on an upper surface 103 of the host substrate 102 between the buffer layer 104 and the host substrate 102. In an embodiment, the nucleation layer may include AlN. The buffer layer 104 may include a number of group III-N semiconductor layers and is supported by the host substrate 102. Each of the semiconductor layers of the buffer layer 104 may include an epitaxially grown group III-nitride epitaxial layer. The group-III nitride epitaxially layer that make up the buffer layer 104 may be nitrogen (N)-face or gallium (Ga)-face material, for example. In other embodiments, the semiconductor layers of the buffer layer 104 may not be epitaxially grown. In still other embodiments, the semiconductor layers of the buffer layer 104 may include Si, GaAs, InP, or other suitable materials.

In an embodiment, the buffer layer 104 is grown epitaxially on the host substrate 102. The buffer layer 104 may include at least one AlGaN mixed crystal layer having a composition denoted by $Al_XGa_{1-X}N$ with an aluminum mole fraction, X, that can take on values between 0 and 1. The total thickness of the buffer layer 104 with all of its layers may be between about 200 angstroms and about 100,000 angstroms although other thicknesses may be used. A limiting X value of 0 yields pure GaN while a value of 1 yields pure aluminum nitride (AlN). An embodiment includes a buffer layer 104 disposed over the host substrate and nucleation layer (not shown). The buffer layer 104 may include additional $Al_XGa_{1-X}N$ layers. The thickness of the additional $Al_XGa_{1-X}N$ layer(s) may be between about 200 angstroms and about 50,000 angstroms through other thicknesses may be used. In an embodiment, the additional $Al_XGa_{1-X}N$ layers may be configured as GaN (N=0) where the $Al_XGa_{1-X}N$ is not intentionally dopes (NID). The additional $Al_XGa_{1-X}N$ layers may also be configured as one or more GaN layers where the one or more GaN layers are intentionally doped with dopants that may include iron (Fe), chromium (Cr), carbon (C) or other suitable dopants that render the buffer layer 104 substantially insulating or high resistivity. The dopant concentration may be between about $10^{17}$ cm$^{-3}$ and $10^{19}$ cm$^{-3}$ though other higher or lower concentrations may be used. The additional $Al_XGa_{1-X}N$ layers may be configured with X=0.01 to 0.10 where the $Al_XGa_{1-X}N$ is NID or, alternatively, where the $Al_XGa_{1-X}N$ is intentionally doped with Fe, Cr, C, or other suitable dopant species. In other embodiments (not shown), the additional layers may be configured as a superlattice where the additional layers include a series of alternating NID or doped $Al_XGa_{1-X}N$ layers where the value of X takes a value between 0 and 1. In still other embodiments, the buffer layer 104 may also include one or more indium gallium nitride (InGaN) layers, with composition denoted $In_YGa_{1-Y}N$, where Y, the indium mole fraction, may take a value between 0 and 1. The thickness of the InGaN layer(s) may be between about 50 angstroms and about 2000 angstroms though other thicknesses may be used.

In an embodiment, a channel layer 106 may be formed over the buffer layer 104. The channel layer 106 may include one or more group III-N semiconductor layers and is supported by the buffer layer 104. The channel layer 106 may include an $Al_XGa_{1-X}N$ layer where X takes on values between 0 and 1. In an embodiment, the channel layer 106 is configured as GaN (X=0) although other values of X may be used without departing from the scope of the inventive subject matter. The thickness of the channel layer 106 may be between about 50 angstroms and about 10,000 angstroms though other thicknesses may be used. The channel layer 106 may be NID or, alternatively, may include Si, germanium (Ge), C, Fe, Cr, or other suitable dopants. The dopant concentration may be between about $10^{15}$ cm$^{-3}$ and about $10^{19}$ cm$^{-3}$ though other higher or lower concentrations may be used. In other embodiments, the channel layer 106 may include NID or doped $In_YGa_{1-Y}N$, where Y, the indium mole fraction, may take a value between 0 and 1.

A barrier layer 108 may be foamed over the channel layer 106 in accordance with an embodiment. The barrier layer 108 may include one or more group III-N semiconductor layers and is supported by the channel layer 106. In some embodiments, the barrier layer 108 has a larger bandgap and larger spontaneous polarization than the channel layer 106 and, when the barrier layer 108 is in direct contact with the channel layer 106, a channel 107 is created in the form of a two-dimensional electron gas (2-DEG) within the channel layer 106 near the interface between the channel layer 106 and barrier layer 108. In addition, strain between the barrier layer 108 and channel layer 106 may cause additional piezoelectric charge to be introduced into the 2-DEG and channel 107. The barrier layer 108 may include at least one NID $Al_XGa_{1-X}N$ layer where X takes on values between 0 and 1. In some embodiments, X may take a value of 0.1 to 0.35, although other values of X may be used. The thickness of the barrier layer 108 may be between about 50 angstroms and about 1000 angstroms though other thicknesses may be used. The barrier layer 108 may be NID or, alternatively, may include Si, Ge, C, Fe, Cr, or other suitable dopants. The dopant concentration may be between about $10^{16}$ and $10^{19}$ cm$^{-3}$ though other higher or lower concentrations may be used. In an embodiment, an additional AlN interbarrier layer (not shown) may be formed between the channel layer 106 and the barrier layer 108, according to an embodiment. The AlN interbarrier layer may increase the channel charge and improve the electron confinement of the resultant 2-DEG. In other embodiments, the barrier layer 108 may include indium aluminum nitride (InAlN) layers, denoted $In_YAl_{1-Y}N$, where Y, the indium mole fraction, may take a value between about 0.1 and about 0.2 though other values of Y may be used. In the case of an InAlN barrier, the thickness of the barrier layer 108 may be between about 30 angstroms and about 2000 angstroms though other thicknesses may be used. In the case of using InAlN to form the barrier layer 108, the InAlN may be NID or, alternatively, may include Si, Ge, C, Fe, Cr, or other suitable dopants. The dopant concentration may be between about $10^{16}$ cm$^{-3}$ and about $10^{19}$ cm$^{-3}$ though other higher or lower concentrations may be used.

In an embodiment illustrated in FIG. 1, a cap layer 109 may be formed over the barrier layer 108. The cap layer 109 presents a stable surface for the semiconductor substrate 110 and serves to protect the surface of the semiconductor substrate 110 from chemical and environmental exposure incidental to wafer processing. The cap layer 109 may include one or more group III-N semiconductor layers and is supported by the barrier layer 108. In an embodiment, the cap layer 109 is GaN. The thickness of the cap layer 109 may be between about 5 angstroms and about 100 angstroms though other thicknesses may be used. The cap layer 109 may be NID or, alternatively, may include Si, Ge, C, Fe, Cr, or other suitable dopants. The dopant concentration may be between about $10^{16}$ cm$^{-3}$ and $10^{19}$ cm$^{-3}$ though other higher or lower concentrations may be used. Without departing from the scope of the inventive subject matter, it should be appreciated that the choice of materials and arrangement of layers to form semiconductor substrate 110 is exemplary. It should be appreciated that the inclusion of the host substrate 102, the buffer layer 104, the channel layer 106, the barrier layer 108, and the cap layer 109 into the semiconductor substrate 110 is exemplary and that the function and operation of the various layers may be combined and may change depending on the materials used in any specific embodiment. For example, in some embodiments (not shown), the cap layer 109 may be omitted. In other embodiments using N-polar materials (not shown), the channel layer 106 may be disposed over the barrier layer 108 to create a 2-DEG and channel 107 directly beneath an optional cap 109 and the gate electrode 160. Still further embodiments may include semiconductor layers formed from materials including GaAs, gallium oxide ($Ga_2O_3$) aluminum gallium arsenide (AlGaAs), indium gallium arsenide (InGaAs), and aluminum indium arsenide (AlInAs) to form the semiconductor substrate 110.

One or more isolation regions 120 may be formed in the semiconductor substrate 110 to define an active region 130 above and along the upper surface 103 of the host substrate 102, according to an embodiment. The isolation regions 120 may be formed via an implantation procedure configured to damage the epitaxial and/or other semiconductor layers to create high resistivity regions 122 of the semiconductor substrate 110 rendering the semiconductor substrate 110 high resistivity or semi-insulating in those high resistivity regions 122 while leaving the crystal structure intact in the active region 125. In other embodiments, the isolation regions 120 may be formed by removing one or more of the epitaxial and/or other semiconductor layers of the semiconductor substrate 110 rendering the remaining layers of the semiconductor substrate 110 semi-insulating and leaving behind active region 125 "mesas" surrounded by high resistivity or semi-insulating isolation regions 120. In still other embodiments, the isolation regions 120 may be formed by removing one or more of the epitaxial and/or other semiconductor layers of the semiconductor substrate 110 and then using ion implantation to damage and further enhance the semi-insulating properties of the remaining layers of the semiconductor substrate 110 and leaving behind active region 125 "mesas" surrounded by high resistivity or semi-insulating isolation regions 120 that have been implanted. In an embodiment, a first dielectric layer 130 may be formed over the active region 125 and isolation region 120. In an embodiment, the first dielectric layer 130 may be formed from one or more suitable materials including silicon dioxide ($SiO_2$), silicon nitride (SiN), silicon oxynitride (SiON), aluminum oxide ($Al_2O_3$), aluminum nitride (AlN), and hafnium oxide ($HfO_2$), though other substantially insulating materials may be used. In an embodiment, the first dielectric layer 130 may have a thickness of between 200 angstroms and 1000 angstroms. In other embodiments, the first dielectric layer 130 may have a thickness of between 50 angstroms and 100000 angstroms, though other thicknesses may be used, protection layer In an embodiment, the source electrode 140 and the drain electrode 145 may be formed over an in contact with the semiconductor substrate 110 in the active region 125. The source electrode 140 and the drain electrode 145 may be formed inside a source opening 132 and a drain opening 134 formed in the first dielectric layer 130. In an embodiment, the source electrode 140 and the drain electrode 145 form ohmic contacts to the channel 107. In an embodiment, the source electrode 140 and the drain electrode 145 may be formed over and in contact with the cap layer 109. In other embodiments (not shown), one or both of the source electrode 140 and the drain electrode 145 may be recessed through the cap layer 109 and extend partially through the barrier layer 108. In an embodiment, the source electrode 140 and the drain electrode 145 may be formed from a multi-layer stack. In an embodiment, the multi-layer stack used to form source electrode 140 and drain electrode 145 may include an adhesion layer and one or more layers, that when annealed, allow an ohmic contract to form between the channel 107 and the source electrode 140 and the drain electrode 145. In an embodiment, the adhesion layer may include titanium (Ti), tantalum (Ta), silicon (Si), or other suitable materials. In an embodiment, the adhesion layer may have a work function that is below 4.5 electron-volts. In still other embodiments, ion implantation may be used to form ohmic contact to the channel 107. In an embodiment, the one or more layers may include Ti, Au, molybdenum (Mo), nickel (Ni), Si, Ge, platinum (Pt), or other suitable materials. In an embodiment, the annealed metals used to form the source electrode 140 and drain electrode 145 may be susceptible to erosion by the various process chemicals used to clean the wafer after the source and drain electrode 140 and 145 have been formed.

In an embodiment, a second dielectric layer (i.e. protection layer) 150 may be formed over the first dielectric layer 130 and one or more of the source electrode 140 and the drain electrode 145. In an embodiment, a first edge 152 of the second dielectric layer 150 may terminate the second dielectric layer 150 between the source electrode and the gate electrode. In an embodiment, a second edge 154 of the second dielectric layer 150 may terminate the second dielectric layer 150 between the drain electrode 145 and the gate electrode 160. In an embodiment, the second dielectric layer 150 may be formed from one or more suitable materials including silicon dioxide ($SiO_2$), silicon nitride (SiN), aluminum oxide ($Al_2O_3$), aluminum nitride (AlN), and hafnium oxide ($HfO_2$), though other substantially insulating materials may be used. In other embodiments, one or more of polyimide, BCB, or other suitable organic-based compounds may be used to form the second dielectric layer 150. In an embodiment, the second dielectric layer 150 may have a thickness of between 200 angstroms and 2000 angstroms. In other embodiments, the second dielectric layer 150 may have a thickness of between 50 angstroms and 10000 angstroms, though other thicknesses may be used. In some embodiment, the second dielectric layer 150 may be resistant to chemistries that may attack the metals used to form source electrode 140 and drain electrode 145. For example, in some embodiments, the second dielectric layer 150 may be able to withstand exposure to ammonium hydroxide ($NH_4OH$), N-methylpyrrolidone (NMP), tetramethylammonium hydroxide (TMAH), hydrochloric acid (HCl), buffered oxide etch (BOE), hydrofluoric acid (HF), and buffered hydrofluoric acid (BHF).

In an embodiment, the gate electrode 160 may be formed over the semiconductor substrate 110 in the active region 125. The gate electrode 160 may include a vertical stem 162, a first protruding region 164 coupled to the vertical stem 162 and terminating at a first gate edge 165, according to an embodiment. In an embodiment a second protruding region 166 may couple to the vertical stem 162 and terminate at a second gate edge 167, according to an embodiment. In an embodiment, the gate electrode 160 may be electrically coupled to the channel 107 through the cap layer 109 and barrier layer 108. Changes to the electric potential applied to the gate electrode 160 shifts the quasi Fermi level for the barrier layer 108 with respect to the quasi Fermi level for the channel layer 106 and thereby modulate the electron concentration in the channel 107 within the semiconductor substrate 110 under the gate electrode 160. Schottky materials such as Ni, Pd, Pt, iridium (Ir)m and Copper (Cu), may be combined with one or more of low stress conductive materials such as Au, Al, Cu, poly Si, or other suitable material(s) in a metal stack to form a gate electrode 160 for a low-loss Schottky gate electrode 160 electrically coupled to channel 107, according to an embodiment. In an embodiment, the gate electrode 160 may be formed, wherein the vertical stem 162 is formed within a gate opening 136 in the first dielectric layer 130. In an embodiment, the gate electrode 160 may be formed between the first edge 152 and second edge 154 that terminate second dielectric layer 150. In an embodiment, the first edge 152 of the second dielectric layer 150 (i.e. protection layer) may terminate under the first protruding region 164. In an embodiment, the second edge 154 of the second dielectric layer 150 (i.e. protection layer) may terminate under the second protruding region 166. In an embodiment, the vertical stem 162 may be self-aligned with the first edge 152 and second edge 154. In an embodiment, there may not be a gap between the first edge 152 and the vertical stem 162 and between the second edge 154 and the vertical stem 162. In other embodiments (not shown) there may be a gap between the vertical stem 162 and the first edge 152 and the second edge 154 of the second dielectric layer 150.

In an embodiment, the gate electrode 160 may be characterized by the gate length 163 within the gate opening 136 and first and second protruding region lengths 168 and 169 where the first and second protruding regions 164 and 166 overlay the first dielectric layer 130 and the second dielectric layer 150. In an embodiment, the gate length 163 may be between about 0.1 microns and about 1 micron. In other embodiments, the gate length 163 may be between about 0.05 microns and about 2 microns, though other suitable dimensions may be used. In an embodiment, the first protruding region length 168 may be between about 0.1 microns and about 0.5 microns. In other embodiments, the first protruding region length 168 may be between about 0.05 microns and 2 microns, though other suitable dimensions may be used. In an embodiment, a second protruding region length 169 may be between about 0.1 microns and about 0.5 microns. In other embodiments, the second protruding region length 169 may be between 0.1 microns and 2 microns, though other suitable lengths may be used.

Without departing from the scope of the inventive subject matter, numerous other embodiments may be realized. The exemplary embodiment of FIG. 1 depicts the gate electrode 160 as T-shaped with a vertical stem 162 and first and second protruding regions 164 and 166 disposed over the first and second dielectric layers 130 and 150. In other embodiments, the gate electrode 160 may be a square shape with no protruding regions (e.g. 162 and 166) over the first and second dielectric layers 130 and 150 (not shown). In other embodiments (not shown), the gate electrode 160 may be recessed through the cap layer 109 and extend partially into the barrier layer 108, increasing the electrical coupling of the gate electrode 160 to the channel 107 through the barrier layer 108. In other embodiments (not shown), the cap layer 109 may be omitted and the gate electrode 160 may contact the barrier layer directly. In still other embodiments, the gate electrode 160 may be disposed over a gate dielectric that is formed between the gate electrode 160 and the semiconductor substrate 110 to form a metal insulator semiconductor field effect transistor (MISFET) device (not shown).

Figure 2:
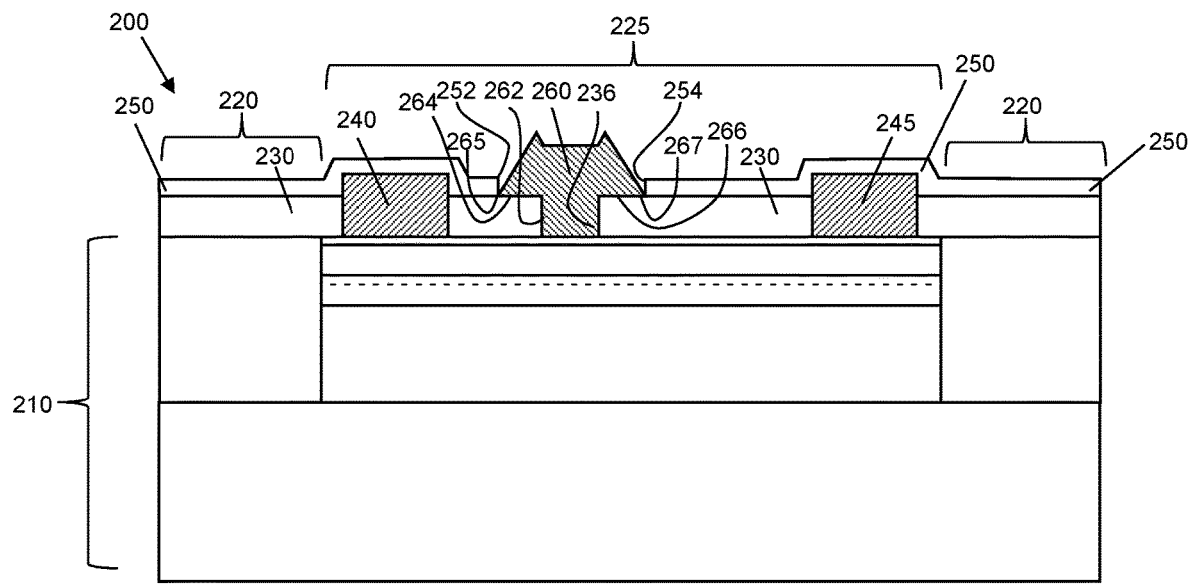
FIG. 2 is a cross-sectional, side view of an exemplary GaN heterojunction field effect transistor (HFET) in accordance with an embodiment.

FIG. 2 is a cross-sectional, side view of an exemplary GaN heterojunction field effect transistor (HFET) 200 in accordance with an embodiment of the inventive subject matter. In an embodiment, the GaN HFET device 200 may include a semiconductor substrate 210, an isolation region 220, an active region 225, a first dielectric layer 230, a source electrode 240, a drain electrode 245, a second dielectric layer 250 (i.e. protection layer), and a gate electrode 260. As is described in connection with the GaN HFET device 100 of FIG. 1, the GaN HFET device 200 may be substantially contained within the active region 225 defined by the isolation region 220, with the first dielectric layer 230, the source electrode 240, drain electrode 245, second dielectric layer 250, and gate electrode 260 disposed over the semiconductor substrate 210. These features are analogous in form and function of like numbered features of the GaN HFET device 100 of FIG. 1 (e.g. 110, 120, 125, 130, 140, 145, 150, and 160, FIG. 1). Thus, for the sake of brevity, the details of these features are not described in detail here.

In an embodiment, the gate electrode 260 may include a vertical stem 262 formed within a gate opening 236. According to an embodiment, the gate electrode 260 may include a first protruding region 264 that extends laterally over the first dielectric layer 230, from the gate stem 262, and toward the source electrode 240, terminating at a first gate edge 265. In an embodiment, a second protruding region 266 may extend laterally over the first dielectric layer 230 from the vertical stem 262, and toward the drain electrode 264, terminating at a second gate edge 267, according to an embodiment. In an embodiment, the first gate edge 265 of the gate electrode 260 may be self-aligned with the first edge 252 of the second dielectric layer 250. Likewise, and in an embodiment, the second gate edge 267 of the gate electrode 260 may be self-aligned with the second edge 254 of the second dielectric layer 250.

Figure 3:
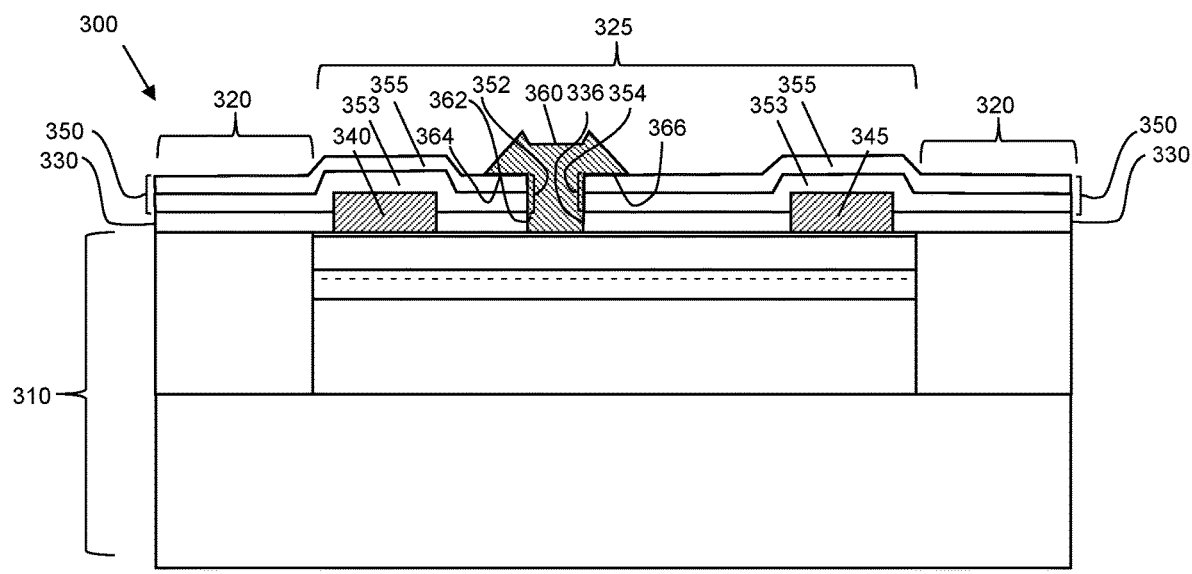
FIG. 3 is a cross-sectional, side view of an exemplary GaN heterojunction field effect transistor (HFET) in accordance with an embodiment.

FIG. 3 is a cross-sectional, side view of an exemplary GaN heterojunction field effect transistor (HFET) in accordance with an embodiment. In an embodiment, the GaN HFET device 300 may include a semiconductor substrate 310, an isolation region 320, an active region 325, a first dielectric layer 330, a source electrode 340, a drain electrode 345, a second dielectric layer 350 (i.e. protection layer), and a gate electrode 360. In an embodiment, a first edge 352 of the second dielectric layer 350 may terminate under a first protruding region 364 of the gate electrode 360 and a second edge 354 of the second dielectric layer 350 may terminate under a second protruding region 366 of the gate electrode 360. In an embodiment, the second dielectric layer 350 may include a lower dielectric layer 353 and one or more upper dielectric layers 355 disposed over the first dielectric layer 330, the source electrode 340, and drain electrode 345. In an embodiment, the lower dielectric layer 353 may include one or more of SiN, $Al_2O_3$, $HfO_2$, $SiO_2$, AlN, or other suitable dielectric materials. In some embodiments, the lower dielectric layer 353 may have a thickness of between 100 angstroms and 500 angstroms. In other embodiments, the lower dielectric layer 353 may have a thickness of between 50 angstroms and 10,000 angstroms, though other thicknesses may be used. In an embodiment, the lower dielectric layer 353 may be wet etchable. In an embodiment, the upper dielectric layer 355 may include one or more dielectric layers. According to an embodiment, the upper dielectric layer 355 may include SiN, $Al_2O_3$, $HfO_2$, $SiO_2$, AlN, or other suitable dielectric materials. In some embodiments, the upper dielectric layer 355 may have a thickness of between 100 angstroms and 500 angstroms. In other embodiments, the upper dielectric layer 355 may have a thickness of between 50 angstroms and 20,000 angstroms, though other thicknesses may be used. In an embodiment, the lower dielectric layer 353 may include $Al_2O_3$ and the upper dielectric layer 355 may include SiN. According to an embodiment, the lower dielectric layer 353 may be selective to a dry etchant of the upper dielectric layer 355. In an embodiment, the first edge 352 and the second edge 354 of the second dielectric layer 350 may be formed at the termination of the lower dielectric layer 353 and the upper dielectric layer 355. In an embodiment, the first edge 352 and the second edge 354 may be self-aligned with the vertical stem 362 of the gate electrode 360.

Figure 4:
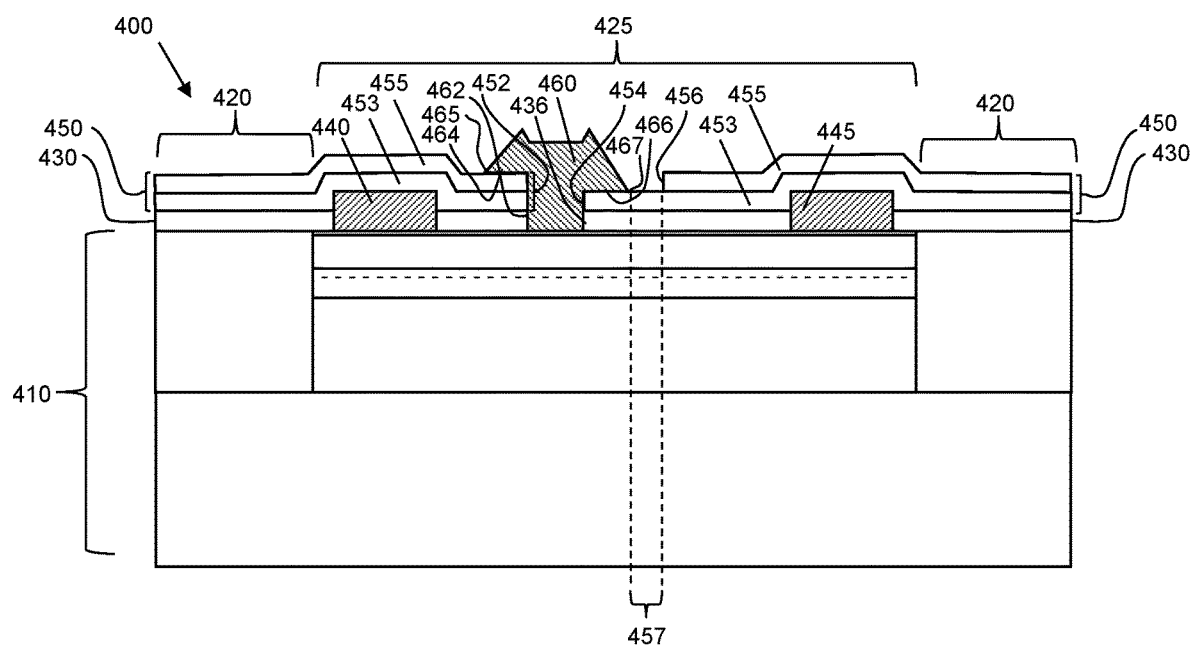
FIG. 4 is a cross-sectional, side view of an exemplary GaN heterojunction field effect transistor (HFET) in accordance with an embodiment.

FIG. 4 is a cross-sectional, side view of an exemplary GaN heterojunction field effect transistor (HFET) in accordance with an embodiment. In an embodiment, the GaN HFET device 400 may include a semiconductor substrate 410, an isolation region 420, an active region 425, a first dielectric layer 430, a source electrode 440, a drain electrode 445, a second dielectric layer 450 (i.e. protection layer), and a gate electrode 460. Analogous to the GaN HFET device 300 of FIG. 3, the second dielectric layer 450 (i.e. protection layer) may include a lower dielectric layer 453 and one or more upper dielectric layers 455 disposed over the first dielectric layer 430, the source electrode 440, and the drain electrode 445. In an embodiment, the upper dielectric layer 455 of the second dielectric layer 450 may be patterned independently of the lower layer 453 of the second dielectric layer 450. In an embodiment, the gate electrode 460 may include a vertical stem 462, a first protruding region 464 extending from the vertical stem 462, toward the source terminal 440, and terminating at a first gate edge 465, that overlies the second dielectric layer 450. The gate electrode 460 may further include a second protruding region 466 extending from the vertical stem 462, toward the drain terminal 545, and terminating at a second gate edge 467. In an embodiment, the second gate edge 467 may overlay the lower dielectric layer 453.

According to an embodiment, a first edge 452 of the second dielectric layer 450 may terminate under the first protruding region 464. In an embodiment, the first edge 452 of the second dielectric layer 450 may include a termination of the lower dielectric layer 453 and a termination of the upper dielectric layer 455. In an embodiment, the termination lower dielectric layer 453 and the upper dielectric layer 455 at the first edge 452 are substantially self-aligned with each other and are self-aligned with the vertical stem 462. In other embodiments, the termination of the lower dielectric layer 453 and the upper dielectric layer 455 at the first edge 452 are not self-aligned with each other, but are rather, patterned separately (not shown). In an embodiment, a second edge 454 the second dielectric layer 450 may include the termination of the lower layer 453. The second edge 454 may terminate under a second protruding region 466 of the gate electrode 460, according to an embodiment. In an embodiment, the second edge 454 may include the lower dielectric layer 453. In an embodiment, the second edge 454 may be self-aligned with a vertical stem 462 of the gate electrode 460. In an embodiment, a third edge 456 that includes the upper dielectric layer 455 of the second dielectric layer 450 may terminate between the second gate edge 467 and the drain electrode 445. In an embodiment, a third edge distance 457 between the gate edge 467 the third edge 456 may have a length of between 0.5 microns and 5 microns. In other embodiments, the third edge distance 457 may have a length of between 0.1 microns and 10 microns. Without departing from the scope of the inventive subject matter, the third edge distance may have other longer or shorter lengths.

Figure 5:
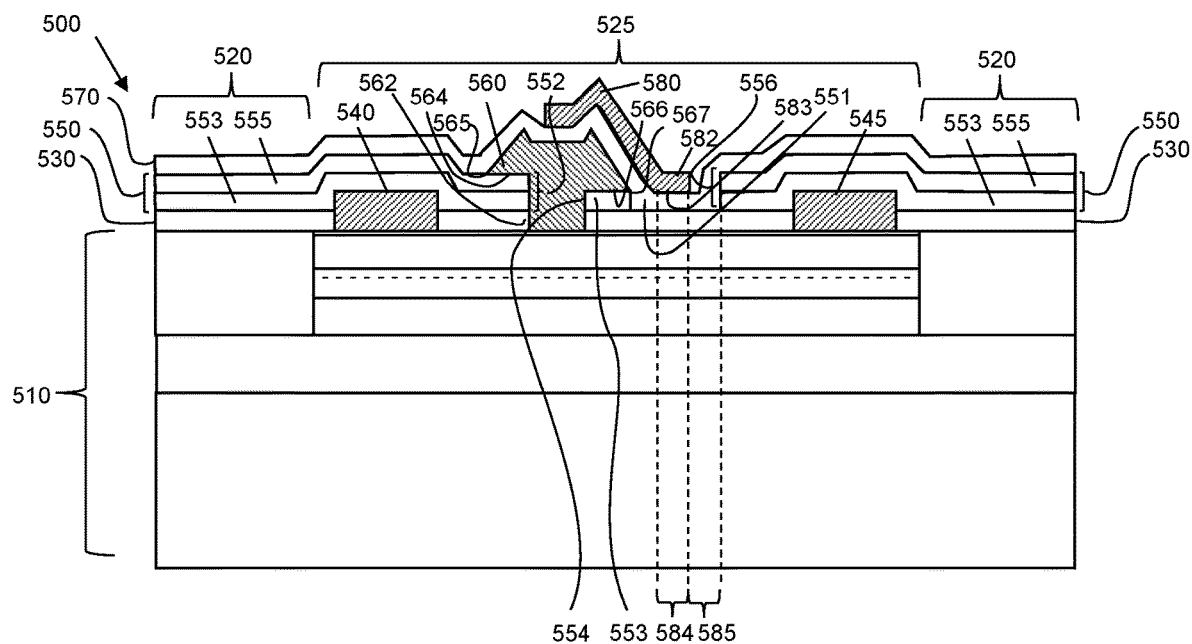
FIG. 5 is a cross-sectional, side view of an exemplary GaN HFET devices in accordance with an embodiment.

FIG. 5 is a cross-sectional, side view of an exemplary GaN heterojunction field effect transistor (HFET) in accordance with an embodiment. In an embodiment, the GaN HFET device 500 may include a semiconductor substrate 510, an isolation region 520, an active region 525, a first dielectric layer 530, a source electrode 540, a drain electrode 545, a second dielectric layer 550 (i.e. protection layer), a gate electrode 560, a third dielectric layer 570, and a field plate 580. Analogous to the GaN HFET devices 300 and 400 of FIGS. 3 and 4, the second dielectric layer 550 (i.e. protection layer) may include a lower dielectric layer 553 and one or more upper dielectric layers 555 disposed over the first dielectric layer 5830, the source electrode 540 and the drain electrode 545, according to an embodiment. In an embodiment, the lower dielectric layer 553 and the upper dielectric layer 55 may be patterned independently. In an embodiment, the gate electrode 560 may include a vertical stem 562, a first protruding region 564 extending from the vertical stem 562, toward the source terminal 540, and terminating at a first gate edge 565, that overlies the second dielectric layer 550. The gate electrode 560 may further include a second protruding region 566 extending from the vertical stem 562, toward the drain terminal 545, and terminating at a second gate edge 567, that may overlay a portion of the lower dielectric layer 553.

In an embodiment, a first edge 552 of the second dielectric layer 550 may be self-aligned with the vertical stem 562 of the gate electrode 560. In an embodiment, the first edge 552 may include the lower dielectric layer 553 and the upper dielectric layer 555. In an embodiment, the termination of the lower dielectric layer 553 and the termination of the upper dielectric layer 555 at the first edge 552 may be self-aligned with each other and may be self-aligned with the vertical stem 562. In other embodiments, the termination of the lower dielectric layer 553 and the termination upper dielectric layer 555 at the first edge 552 are not self-aligned with each other, but are, rather, patterned separately (not shown). In an embodiment, a second edge 554 of the second dielectric layer 550 ("second protection layer edge") may include the lower dielectric layer 553 of the second dielectric layer 550 and may be self-aligned with the vertical stem 562 of the gate electrode. In an embodiment, a portion of the lower dielectric layer 553 may be disposed under the second protruding region 566 extending from the vertical stem 562 to the second gate edge 567, creating a lower dielectric layer gap 551 in the lower dielectric layer 553 adjacent the gate electrode 560. In an embodiment, the lower dielectric layer gap 551 may extend from the second gate edge 567 to a third edge 556 of the second dielectric layer 550. In an embodiment, the third edge of the second dielectric layer 550 ("third protection layer edge") may include the lower dielectric layer 553 and the upper dielectric layer 555 and may be self-aligned withe the second gate edge 567.

In an embodiment, the third dielectric layer 570 may be disposed over the second dielectric layer 550, the source and drain electrodes 545 and 550, and the gate electrode 560. In an embodiment, the third dielectric layer 570 may include one or more of SiN, $SiO_2$, AlN, $HfO_2$, $Al_2O_3$, spin on glass, or other suitable insulating materials. In an embodiment, the third dielectric layer 570 may have a thickness of between about 500 angstroms and about 5000 angstroms. In other embodiments, the third dielectric layer 570 may have a thickness between about 100 angstroms and about 20000 angstroms. In an embodiment, a field plate 580 may be disposed over the third dielectric layer 570 and over the gate electrode 560 on the side of the gate electrode 560 facing the drain electrode 545. In an embodiment, the field plate 580 may be coupled the source electrode 540. In other embodiments (not shown), the field plate 580 may be disposed over the third dielectric layer 570, over the gate electrode: 580, and may wrap around the gate electrode 560 on the sides of the gate electrode 560 that face the source electrode 540 and the drain electrode 560, and extend to and contact the source electrode 540. In an embodiment, the field plate 580 reduces the electric field between the gate electrode 560 and the drain electrode 545. In an embodiment, a field plate drain extension 582 may extend from the portion of the gate electrode 570 facing the drain electrode 545 toward the drain electrode 545 by a field plate drain extension length 584. In an embodiment, a lower surface 583 of the field plate drain extension 582 may be coplanar with the second protruding region 566 of the gate electrode 560 where the second protruding region 560 contacts the first dielectric layer 530.

In other embodiments, the lower surface 583 of the field plate drain extension 582 may be below the second protruding region 566 of the gate electrode 560 where the second protruding region 560 contacts the first dielectric layer 530. In still other embodiments, the lower surface 583 of the field plate drain extension 582 may be above the second protruding region 566 of the gate electrode 560 where the second protruding region 560 contacts the first dielectric layer 530. In an embodiment, the field plate drain extension length 584 characterizes the overlap of the field plate 580 over the third dielectric layer 570 and the bottom dielectric layer 555 of the second dielectric layer 550. In an embodiment, the field plate drain extension length 584 may be between about 0.2 microns and 2 microns. In other embodiments, the field plate drain extension length 584 may be between about 0.1 and about 10 microns. Without departing from the scope of the inventive subject matter, the field plate extension length 584 may have other longer or shorter lengths. In an embodiment, a field plate drain length 585 characterizes the distance between the field plate extension 582 from the second edge 554 of the second dielectric layer 550. In an embodiment, the field plate drain length 585 may be between about 0.4 microns and 2 microns. In other embodiments, the field plate drain length 585 may be between about 0.2 and about 10 microns. Without departing from the scope of the inventive subject matter, the field plate drain length 585 may have other longer or shorter lengths. In an embodiment, the field plate 580 may be coupled to a ground potential. In other embodiments, the field plate 580 may be coupled to the gate electrode 560. In other, further embodiments, the field plate 580 may be coupled to an arbitrary potential.

Figure 6:
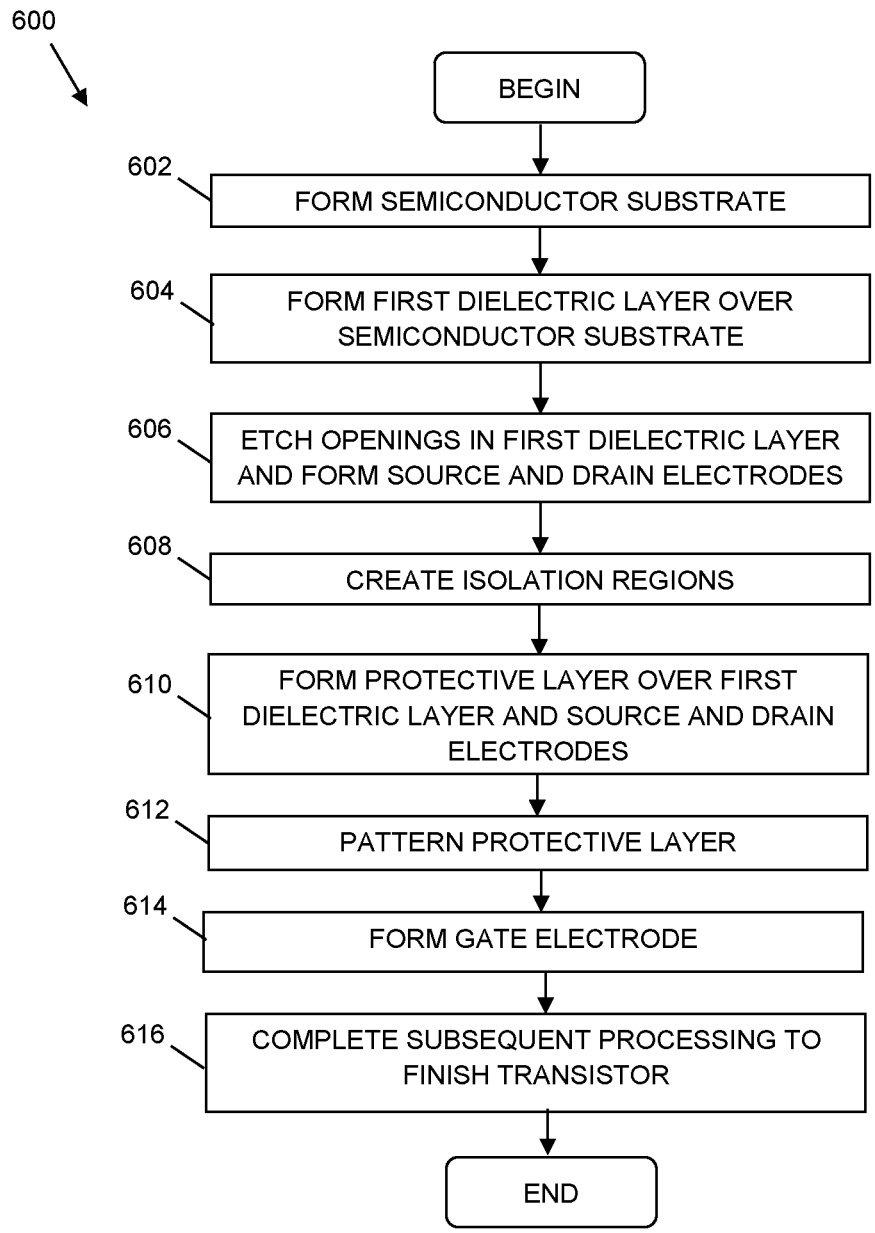
FIG. 6 is a process flow diagram describing a method for fabricating the GaN heterojunction field effect transistor (HFET) devices FIGS. 1-5 in accordance with an embodiment.

The flowchart 600 of FIG. 6 describes embodiments of methods for fabricating semiconductor devices (e.g. GaN HFET devices 100, 200, 300, 400, 500 of FIGS. 1-5). FIG. 6 should be viewed alongside FIGS. 7, 8, 9A, 9B, 9C, 10, 11A, 11B, 12A, 12B, 12C, 12D, 12E, 13A, 13B, 13C, 13D, and 13E which illustrate cross-sectional, side views of a series of fabrication steps for producing the semiconductor devices of FIGS. 1-5, in accordance with an example embodiment.

Figure 7:
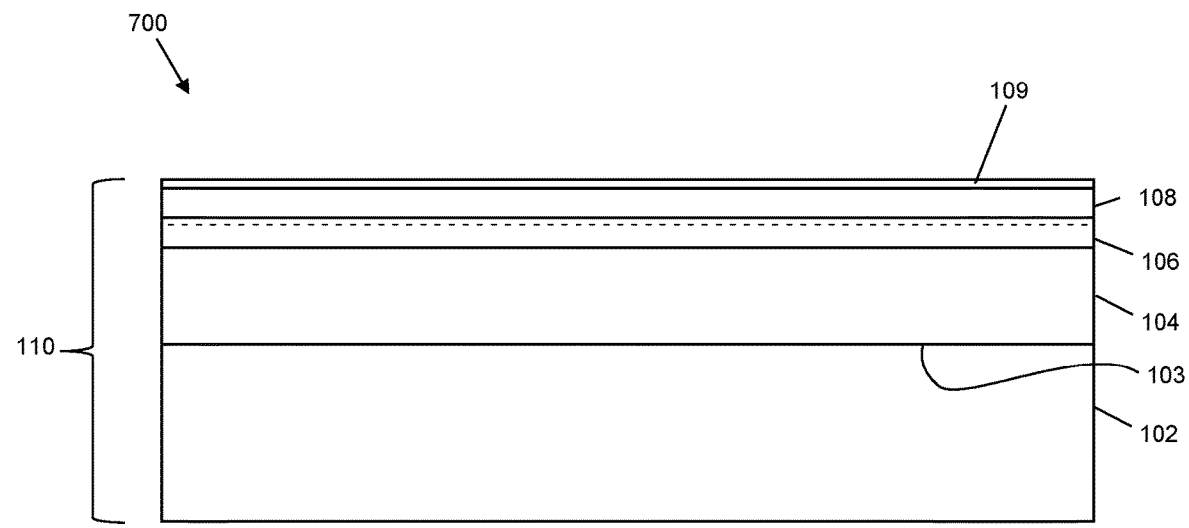
FIG. 7 is a cross-sectional, side view of a of fabrication step for producing an GaN HFET device, in accordance with embodiments of the method of fabrication.

In block 602 of FIG. 6, and as depicted in the step 700 of FIG. 7, an embodiment of the method may include forming a semiconductor substrate 110. In an embodiment, the step 700 may include providing a host substrate 102 and forming number of semiconductor layers on or over the host substrate 102. In an embodiment, the host substrate 102 may include SiC, or may include other materials such as sapphire, Si, GaN, AlN, diamond, poly-SiC, silicon on insulator, GaAs, InP, or other substantially insulating or high resistivity materials. Forming the semiconductor layers may include forming a nucleation layer (not shown) on or over an upper surface 103 of the host substrate 102, forming a buffer layer 104 on or over the nucleation layer, forming the channel layer 106 on or over the buffer layer 104, forming the barrier layer 108 on or over the channel layer 106, and forming the cap layer 109 on or over the barrier layer 108. As discussed previously, embodiments of the buffer layer 104, the channel layer 106, the buffer layer 108, and the cap layer 109 may include materials selected from AlN, GaN, AlGaN, InAlN, InGaN, or other suitable materials. The semiconductor layers 104, 106, 108, and 109 may be grown using one of metal-organo chemical vapor deposition (MOCVD), molecular beam epitaxy (MBE), hydride-vapor phase epitaxy (HVPE), or a combination of these techniques, although other suitable techniques may alternatively be used. Semiconductor substrate 110 results.

Figure 8:
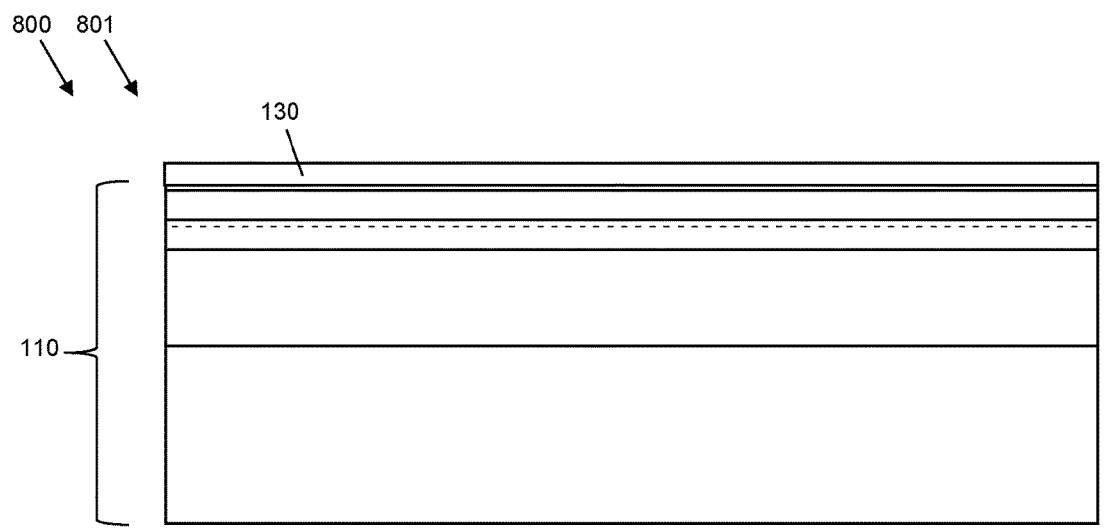
FIG. 8 is a cross-sectional, side view of a of fabrication step for producing an GaN HFET device, in accordance with embodiments of the method of fabrication.

In block 604 of FIG. 6, and as depicted in a step 800 of FIG. 8, an embodiment of the method may include forming a first dielectric layer 130 on or over the semiconductor substrate 110. As discussed previously, in an embodiment, the first dielectric layer 130 may include materials selected from SiN, $Al_2O_3$, $SiO_2$, AlN, and $HfO_2$. The first dielectric layer 130 may be formed using one or more of low pressure chemical vapor deposition (LPCVD), atomic layer deposition (ALD), sputtering, physical vapor deposition (PVD), plasma-enhance chemical vapor deposition (PECVD), MOCCD, MBE, inductively coupled plasma (ICP) deposition, electron-cyclotron resonance (ECR) deposition, or other suitable techniques. In other embodiments, the first dielectric layer 130 may be formed, in-situ, immediately after and in the same chamber or deposition system (e.g. MOCVD or MBE) as the growth of the semiconductor layers of semiconductor substrate 110. Structure 801 results.

Figure 9A:
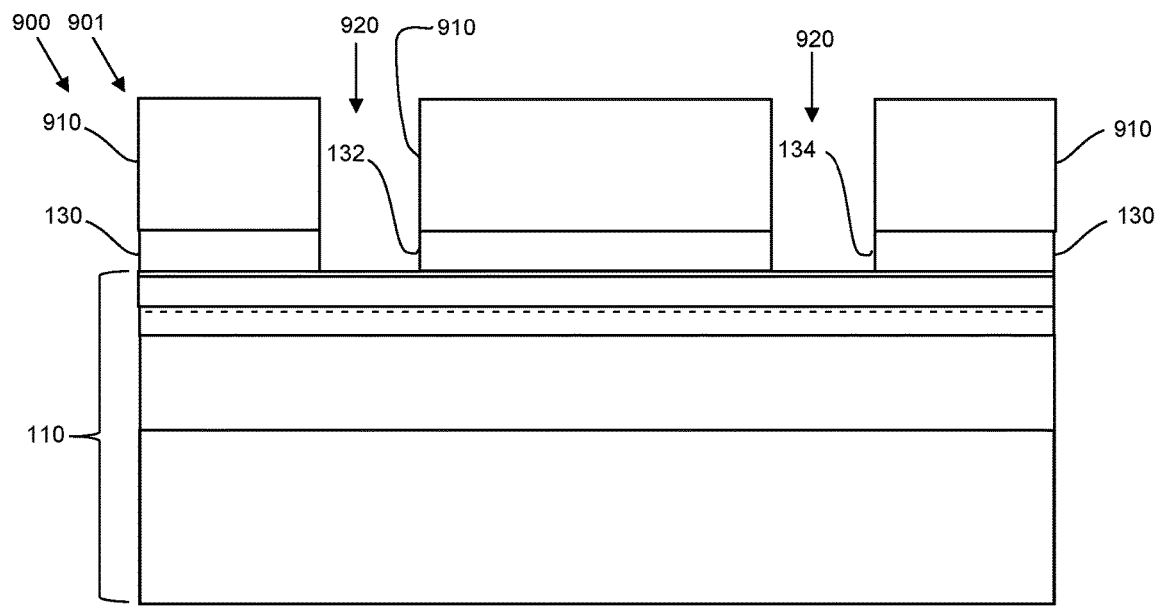
FIGS. 9A, 9B, and 9C are cross-sectional, side views of fabrication steps for producing an GaN HFET device, in accordance with embodiments of the method of fabrication.
Figure 9B:
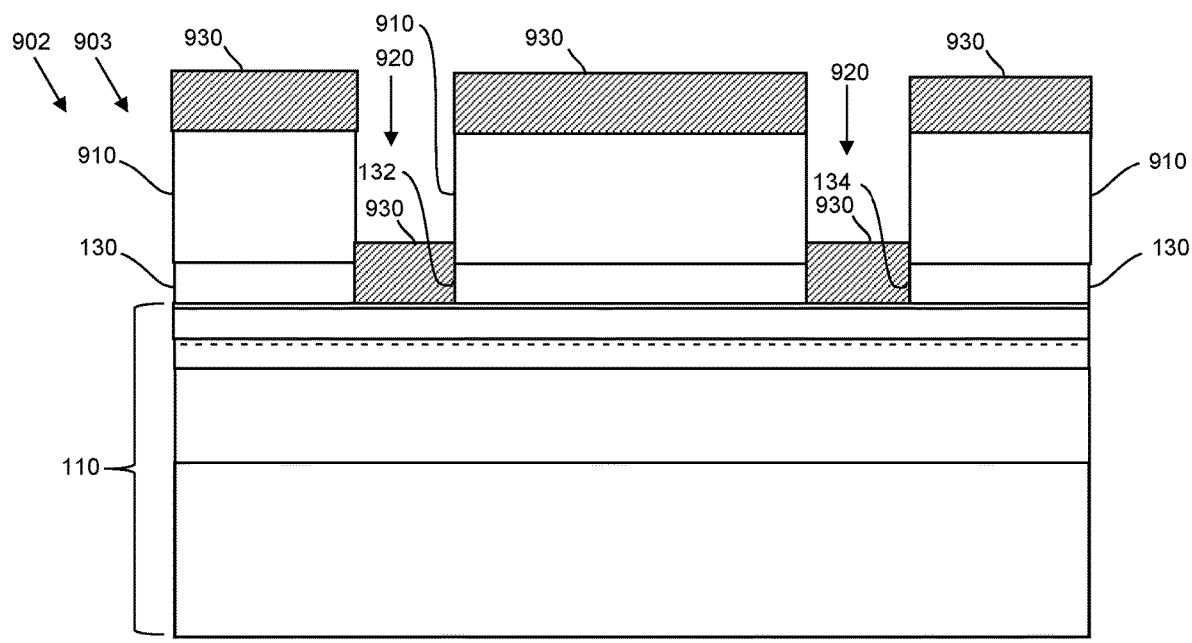
Figure 9C:
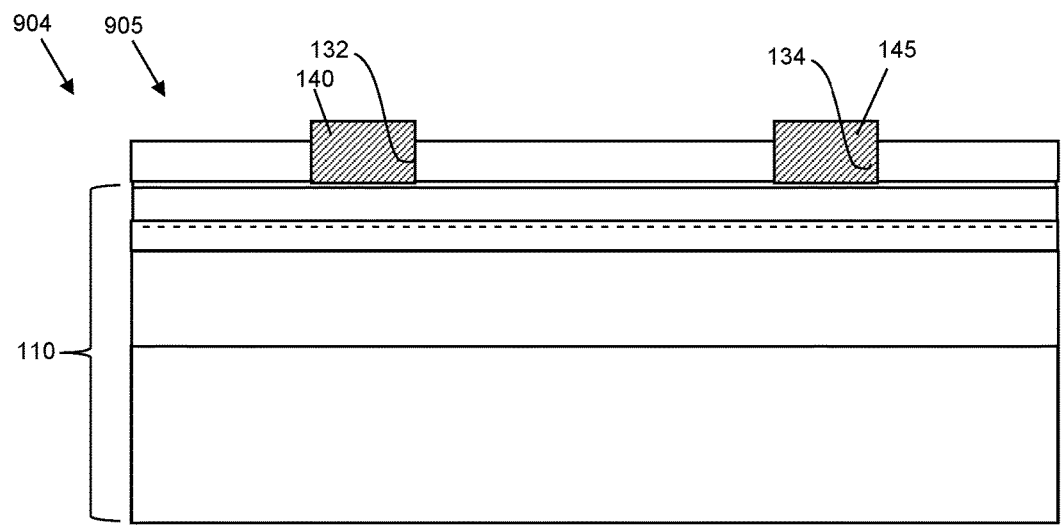

In block 606 of FIG. 6, and as depicted in steps 900, 902, and 904 of FIGS. 9A, 9B, and 9C, an embodiment of the method may include forming source and drain openings 132 and 134 in the first dielectric layer 130 and forming the source and drain electrodes 140 and 145. In an embodiment, and referring to FIG. 9A, forming the source and drain openings 132 and 134 may include dispensing a resist layer 910 over the first dielectric layer 130 and patterning the resist layer 910 to form resist openings 920. In an embodiment, source and drain openings 132 and 134 may be created by etching through the first dielectric layer 130 in areas exposed by the resist openings 920. Etching the first dielectric layer 130 (e.g. SiN) may include etching using one or more dry and/or wet etch technique(s) such as reactive ion etching (RIE), ICP etching, ECR etching, and wet chemical etching according to an embodiment. Suitable wet-etch chemistries may include hydrofluoric acid (HF), buffered HF, buffered oxide etch (BOE), phosphoric acid ($H_3PO_4$), or other suitable wet etchant(s), according to an embodiment. These dry etching techniques may use one or more of sulphur hexafluoride ($SF_6$), di-carbon hexafluoride ($C_2F_6$), carbon tetrafluoride ($CF_4$), tri-fluoromethane ($CHF_3$) or other suitable chemistry, to remove SiN, according to an embodiment. In an embodiment, the etchant used to etch the first dielectric 130 may selectively etch a portion of the first dielectric layer 130 and then stop on an etch stop layer (not shown) (e.g. $Al_2O_3$ or AlN). In an embodiment, etching the etch stop layer (e.g. an $Al_2O_3$ or AlN etch stop layer) may include wet and/or dry etch techniques. In other embodiment(s), dry etching of the etch stop layer (e.g. an AlN or $Al_2O_3$ etch stop) may include dry etching using suitable techniques (e.g. RIE, ICP, or ECR) in conjunction chlorine-based chemistry such as $Cl_2$, boron trichloride ($BCl_3$), or other suitable dry-etch chemistries. Structure 901 results.

Referring again to block 606 of FIG. 6, and as depicted in step 902 of FIG. 9B, an embodiment of the method may include forming and patterning source and drain electrodes 140 and 145 in source and drain openings 132 and 134. In an embodiment, the method may include depositing a metal layer 930 over the resist layer 910 and into the source and drain openings 132 and 134 formed by etching the first dielectric layer 130 exposed in the resist openings 920 formed in the resist layer 910. In an embodiment, the metal layer 930 may contain one or more metal layers that include Ti, Ta, Al, Mo, Au, Ni, Si, Ge, platinum (Pt), tungsten (W), and or other refractory metals, that when annealed, will form an ohmic contact with the semiconductor substrate 110. In an embodiment, the metal layer 930 may include a stack deposited on the substrate that includes Ti, Al, Mo, and Au. In an embodiment, to form the metal layer 930, a Ti layer may be disposed over the semiconductor substrate 110, an Al layer may be disposed over the Ti layer, a Mo layer may be disposed over the Al layer, and an Au layer may be disposed over the Mo layer. In an embodiment, the metal layer 930 may be deposited by evaporation. In other embodiments, the metal layer 930 may be deposited by sputtering, PVD, or other suitable deposition techniques. In an embodiment, the Ti layer may be between about 100 angstroms and 200 angstroms thick, all Al layer may be between about 600 angstroms and 1500 angstroms thick, the Mo layer may be between about 200 angstroms and 700 angstroms thick, and the Au layer may be between about 300 angstroms and 1000 angstroms thick. In other embodiments, other metals may be substituted (e.g. Ni or Pt may be added with substituted for Mo or Ta may be added to or substituted for Ti) and other thicknesses may be used. In an embodiment, the resist layer 910 may be configured in a lift-off profile, wherein the openings of the resist layer 910 have a retrograde profile, allowing the metal not deposited into resist openings 920 to "lift off" when dissolved in solvents. In other embodiments (not shown), the source and drain electrodes 140 and 145 may be patterned by dry etching. Structure 903 results.

Referring again to block 606 of FIG. 6, and as depicted in step 904 of FIG. 9C, an embodiment of the method may include annealing source and drain electrodes 140 and 145 in source and drain openings 132 and 145. In an embodiment, annealing the source and drain electrode 140 and 145 may include an annealing step used to alloy the metal layer 930 of FIG. 9B resulting in ohmic contacts to the semiconductor substrate 110 that form source and drain electrodes 140 and 145. In an embodiment, the annealing step may be accomplished by rapid thermal annealing. In an embodiment, the metal layer 930 of FIG. 9B that remains in source and drain openings 132 and 134 of FIG. 9B may be alloyed at a temperature of between about 700 degrees Celsius and 900 degrees Celsius for between about 15 seconds and about 60 seconds. In other embodiments the metal layer 930 of FIG. 9B may be annealed at between about 500 degrees Celsius and about 1000 degrees Celsius for between about 10 seconds and about 600 seconds, though other higher or lower temperatures and times may be used. In an embodiment, the metal stack used to form metal layer 930 (e.g. Ti, Al, Mo, and Au) will mix to form the source and drain electrodes 140 and 145. In an embodiment, the annealed metal stack 930 used to form the source and drain ohmic contact 145 may have a sheet resistance of about 1 ohms per square to about 10 ohms per square. Structure 905 results.

Figure 10:
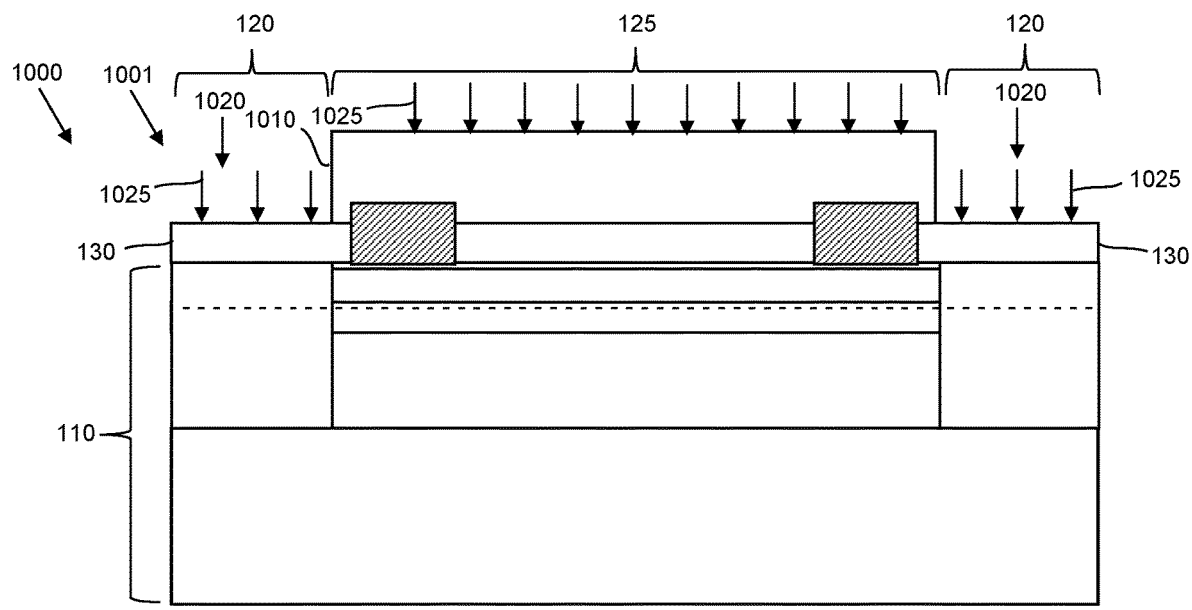
FIG. 10 is a cross-sectional, side view of a of fabrication step for producing an GaN HFET device, in accordance with embodiments of the method of fabrication.

Referring again to block 608 and step 1000 of FIG. 10, and in an embodiment, the method may include creating isolation regions 120. Forming the isolation regions 120 may include dispensing and patterning a resist mask 1010 over the first dielectric layer 130 and source and drain ohmic contacts 140 and 145, and then defining openings 1020 in the resist mask 1010. Using ion implantation, a dopant species 1025 (e.g. one or more of oxygen, nitrogen, boron, and helium) may be driven into the semiconductor substrate 110 to create the isolation regions 120. In an embodiment, the energy and dose of the implant may be configured to create a sufficient amount of damage in the crystal structure of the semiconductor substrate 110 such that the semiconductor substrate is substantially insulating within the isolation regions 120. In other embodiments (not shown), forming the isolation regions 120 may include, first, etching some or all of the semiconductor layers in the semiconductor substrate 110 and then ion implanting to enhance the resistivity in the remaining semiconductor layers and/or the host substrate 102. Structure 1001 results.

Figure 11A:
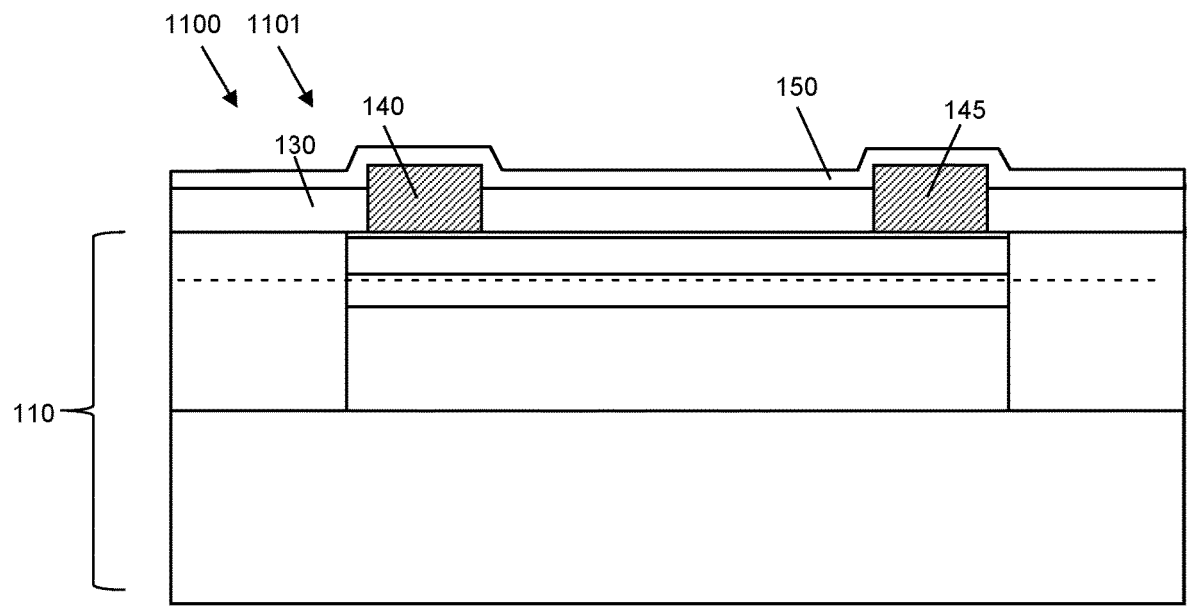
FIGS. 11A and 11B are cross-sectional, side views of fabrication steps for producing an GaN HFET device, in accordance with embodiments of the method of fabrication.

Referring now to block 610 and step 1100 of FIG. 11A, in an embodiment the method may include depositing the second dielectric layer 150 (i.e. protection layer) over the first dielectric layer 130 and source and drain electrodes 140 and 145 to protect the source and drain electrodes 140 and 145 from process chemicals that may erode them and increase the sheet resistance of the annealed metal used to form source and drain electrodes 140 and 145. In an embodiment and as described in connection with the semiconductor device 100 of FIG. 1, the second dielectric layer 150 may be formed from one or more suitable materials including silicon dioxide ($SiO_2$), silicon nitride (SiN), aluminum oxide ($Al_2O_3$), aluminum nitride (AlN), and hafnium oxide ($HfO_2$), though other substantially insulating materials may be used. IN other embodiments, one or more of polyimide, BCB, or other suitable organic-based compounds may be used to form the second dielectric layer 150. In an embodiment, the second dielectric layer 150 may be impervious to wafer process chemicals such as, but not limited to, NMP, HCl, $NH_4OH$, and TMAH. In an embodiment, the second dielectric layer 150 may include a single dielectric layer. In an embodiment, the second dielectric layer 150 may be formed using PECVD, ICP, ECR, ALD, LPCVD, or PVD (e.g. sputtering). In other embodiments (i.e. polyimide, BCB, materials used to form the second dielectric layer 150 may be deposited by spinning on the material in liquid form and then curing it at a temperature sufficient to harden it. Structure 1101 results.

Figure 11B:
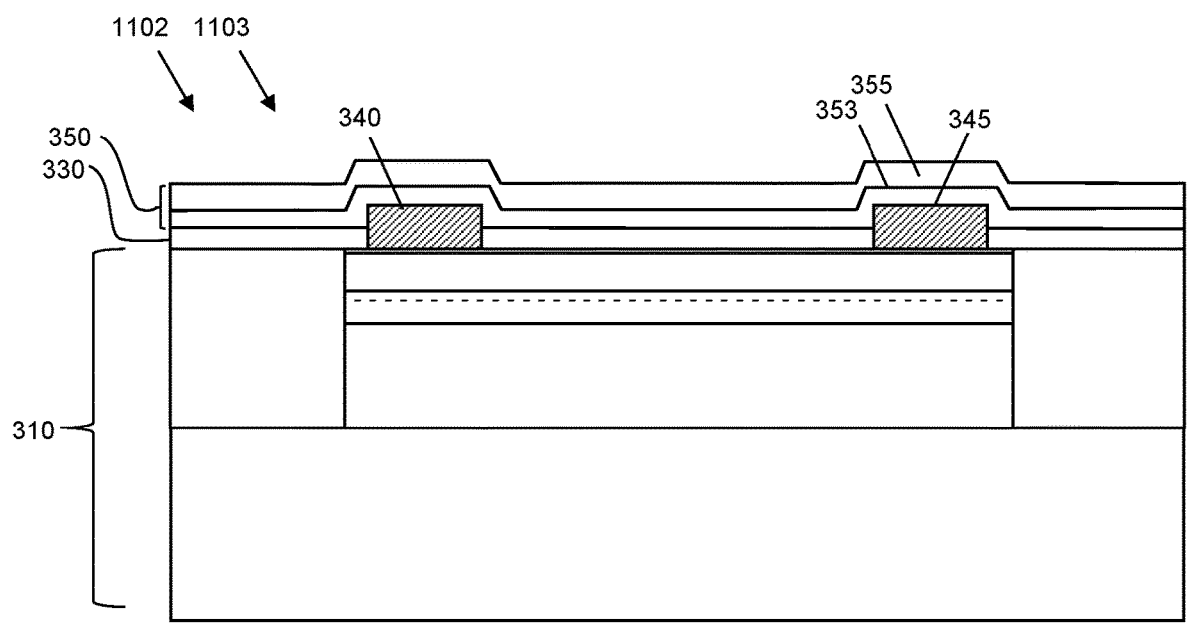

Referring again to block 610 of FIG. 6 and to step 1102 of FIG. 11B, forming the second dielectric layer 350 (i.e. protection layer) of the semiconductor device 300 of FIG. 3 (and, by extension, FIGS. 4-5) may include forming a second dielectric layer 350 that includes a lower dielectric layer 353 and an upper dielectric layer 355 over the first dielectric layer 330 and the source and drain electrodes 340 and 345. In an embodiment, the lower dielectric layer 353 may include one or more of SiN, $SiO_2$, $Al_2O_3$, AlN, $HfO_2$, or other suitable materials. In some embodiments, the lower dielectric layer 353 may include an etch stop layer such as $Al_2O_3$ or AlN. In an embodiment, the upper dielectric layer 355 may include one or more of SiN, $SiO_2$, $Al_2O_3$, AlN, $HfO_2$, or other suitable materials. In an embodiment, the upper dielectric layer 355 may be configured to be dry etchable in a F-containing chemistry (e.g. SiN, etchable with SF6) and the lower dielectric layer 353 may be configured as an etch stop (e.g. Al2O3 or AlN) that blocks F-based etches (e.g. SF6). In an embodiment, both the lower dielectric layer 353 and the upper dielectric layer 355 may be resistant to process chemicals including acids, bases, and solvents used to process semiconductor device embodiments 300, 400, 500 and may protect the source electrodes 340, 440, 540 and drain electrodes 345, 445, and 545 from these process chemicals. Structure 1103 results.

Referring now to block 612 of FIG. 6 and steps 1200, 1202, 1204, 1206, and 1208 of FIGS. 12A, 12B, 12C, 12D, and 12E, in an embodiment, the method may include patterning the second dielectric layer 150 (i.e. protection layer) formed over the first dielectric layer 130 and source and drain electrodes 140 and 145 to allow formation of additional electrodes (e.g. gate electrodes and field plate electrodes). FIGS. 12A, 12B, 12C, 12D, and 12E show the patterning the second dielectric layer for the embodiments of semiconductor devices 100-500 of FIGS. 1, 2, 3, 4, and 5.

Figure 12A:
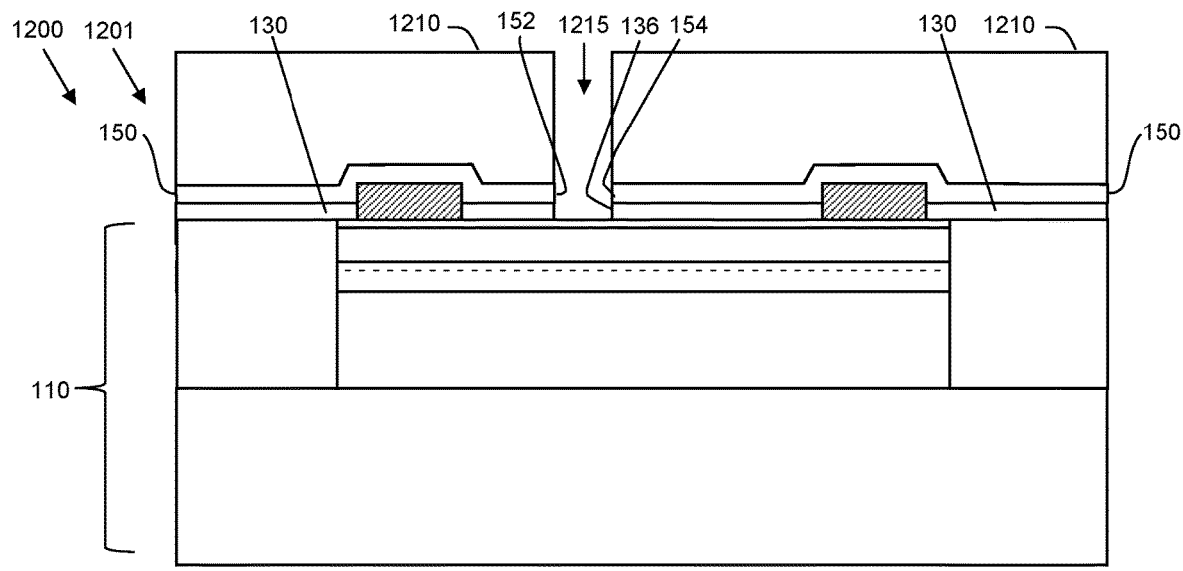
FIGS. 12A, 12B, 12C, 12D, and 12E are cross-sectional, side views of fabrication steps for producing an GaN HFET device, in accordance with embodiments of the method of fabrication.

Referring first to block 612 of FIG. 6 and to step 1200 in FIG. 12A, in an embodiment, patterning the second dielectric layer 150 may include patterning a resist layer 1210 and forming an opening 1215 in the first dielectric layer 130 and the second dielectric layer 150 (i.e. "protection layer"). In an embodiment, forming the opening 1215 results in the formation of the first dielectric edge 152, the second dielectric edge 154, and the gate opening 136 formed in the protection layer 150. Etching the second dielectric layer 150 (e.g. SiN) may include etching using one or more dry and/or wet etch technique(s) such as reactive ion etching (RIE), ICP etching, ECR etching, and wet chemical etching according to an embodiment. Suitable wet-etch chemistries may include hydrofluoric acid (HF), buffered HF, buffered oxide etch (BOE), phosphoric acid ($H_3PO_4$), or other suitable wet etchant(s), according to an embodiment. These dry etching techniques may use one or more of sulphur hexafluoride ($SF_6$), di-carbon hexafluoride ($C_2F_6$), carbon tetrafluoride ($CF_4$), tri-fluoromethane ($CHF_3$) or other suitable chemistry, to remove SiN, according to an embodiment. In an embodiment, the etchant used to etch the second dielectric 150 may selectively etch the second dielectric layer 150 and then stop on the first dielectric layer 130 wherein the first dielectric layer 130 is configured as an etch stop (e.g. $Al_2O_3$ or AlN). In an embodiment, etching the first dielectric layer 130 (e.g. an $Al_2O_3$ or AlN etch stop layer) to form gate opening 136 may include wet and/or dry etch techniques. In other embodiment(s), dry etching of the first dielectric layer 130 (e.g. an AlN or $Al_2O_3$ etch stop) may include dry etching using suitable techniques (e.g. RIE, ICP, or ECR) in conjunction chlorine-based chemistry such as $Cl_2$, boron trichloride ($BCl_3$), or other suitable dry-etch chemistries. In other embodiments, ion milling may be used to etch the first dielectric layer 130. In some embodiments, etching of the first dielectric layer 130 may include combining wet and dry chemistries. Structure 1201 results.

Figure 12B:
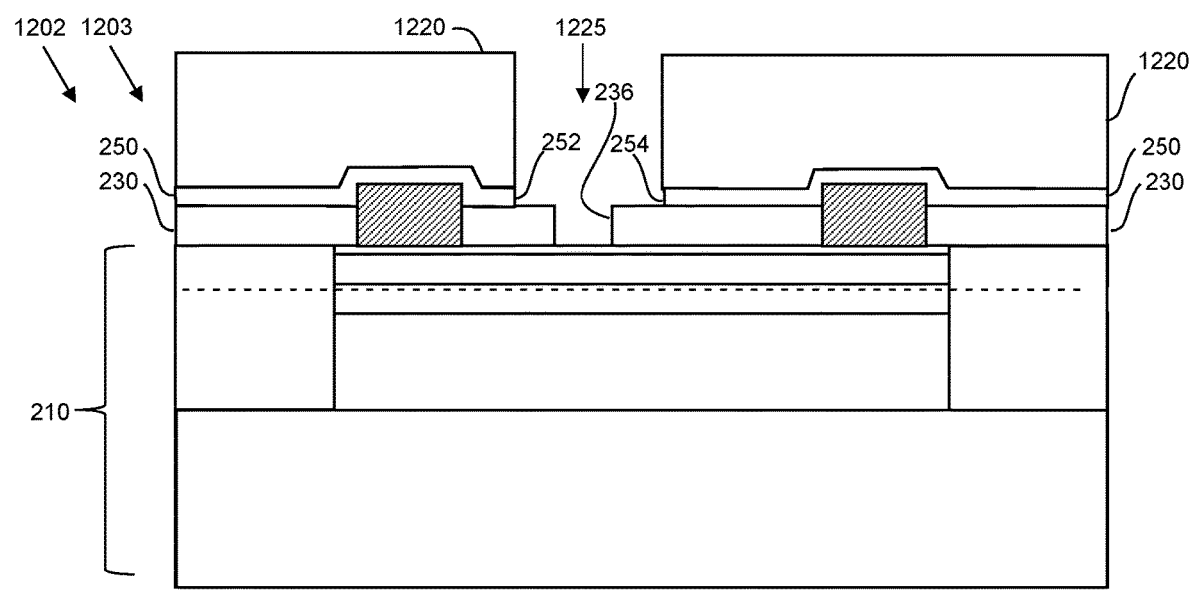
Figure 13A:
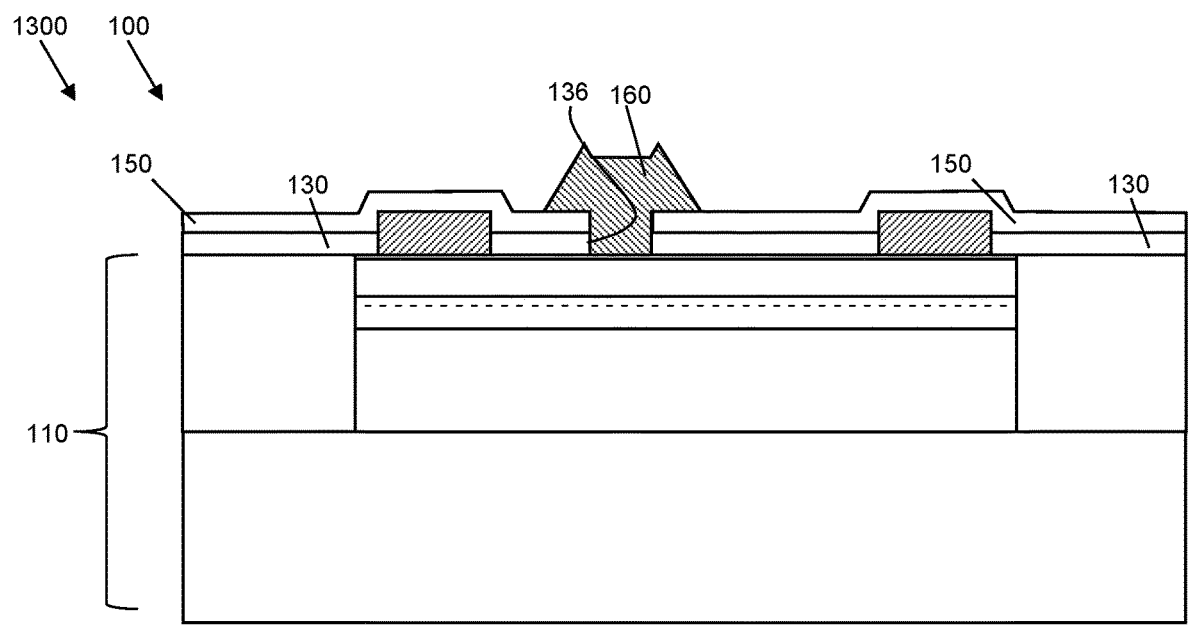
FIGS. 13A, 13B, 13C, 13D, and 13E are cross-sectional, side views of fabrication steps for producing an GaN HFET device, in accordance with embodiments of the method of fabrication.
Figure 13B:
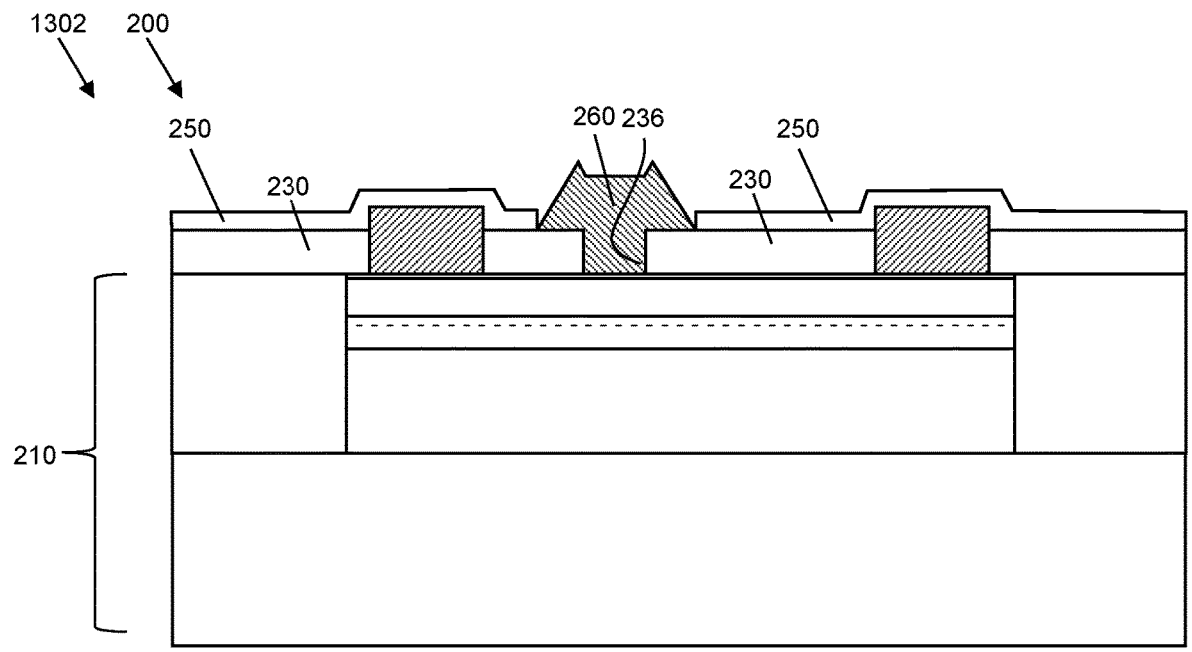

Referring next to step 1202 in FIG. 12B, in an embodiment, patterning the second dielectric layer 250 of the semiconductor device 200 of FIG. 2 may include forming a gate opening 236 in the first dielectric layer 230, patterning a resist layer 1220, and forming an opening 1225 in the second dielectric layer 250. In an embodiment of the method, a resist layer (not shown) may be used to pattern and etch an opening in the second dielectric layer 250 (not shown) and the gate opening 236 the first dielectric layer 230, followed by dispensing and patterning resist layer 1220 and forming the opening 1225 in the second dielectric layer 250. In an embodiment of the method, forming the opening 1225 forms the first edge 252 and the second edge 254 in the second dielectric layer 250. In an embodiment, the dry and/or wet etch chemistries used to etch the first and second dielectric layers 130 and 150 in the fabrication of semiconductor device 100 depicted in step 1200 of FIG. 12A may be used to etch the second dielectric layer 250. In an embodiment, a resist layer 1220 may then be patterned for lifting off the metal used to form the gate electrode 260 as depicted in FIG. 13B.

In an embodiment, the wet and/or dry etch chemistries may be used to etch the second dielectric layer 250 of the semiconductor device 200 of FIG. 2 in the step 1200 of FIG. 12B may be used to etch the second dielectric layer 250. In an embodiment, the first dielectric layer 230 may be selective to the etch of the second dielectric layer 250. In an embodiment, this selectivity may be accomplished by forming the second dielectric layer 250 using PECVD SiN that is readily etched using a wet etchant (i.e. buffered HF or buffered oxide etch), and forming the first dielectric layer 230 using LPCVD SiN that provides a wet etch rate that is substantially lower. In an embodiment the wet etch rate of PECVD SiN used to form the second dielectric layer 250 in buffered oxide etch used to etch the first and second dielectric layers 230 and 250 may be between about 100 and about 500 angstroms per minute and the wet etch rate of LPCVD SiN used to form the first dielectric 230 may be between about 0.1 and 10 angstroms per minute. In other embodiments, other wet etch rates may be used. In an embodiment, the etch selectivity between the second dielectric layer 250 and the first dielectric layer 230 may be between 10:1 and 100:1. Thus, in an embodiment, the opening 1225 may be etched in the second dielectric layer 250 without reducing the thickness of first dielectric layer 230 or significantly enlarging the gate opening 236 (e.g. less than 10%). In other embodiments, one having skill in the art will recognize that alternate materials and chemistries may be used. In these other embodiments, the second dielectric layer 250 may be formed from an Al-containing dielectric layer such as $Al_2O_3$ or AlN that are readily wet etchable in hydroxide-based etchants (e.g. ammonium hydroxide) compared to SiN used for the first dielectric layer 230. Analogous to the discussion of selectively etching the second dielectric layers 130 over the first dielectric layer 130 in conjunction with FIG. 12A, the second dielectric layer 250 may be etched selectively over the first dielectric layer 230. In an embodiment, the second dielectric layer 250 (e.g. PECVD SiN) may be etched using dry etching. Structure 1203 results.

Figure 12C:
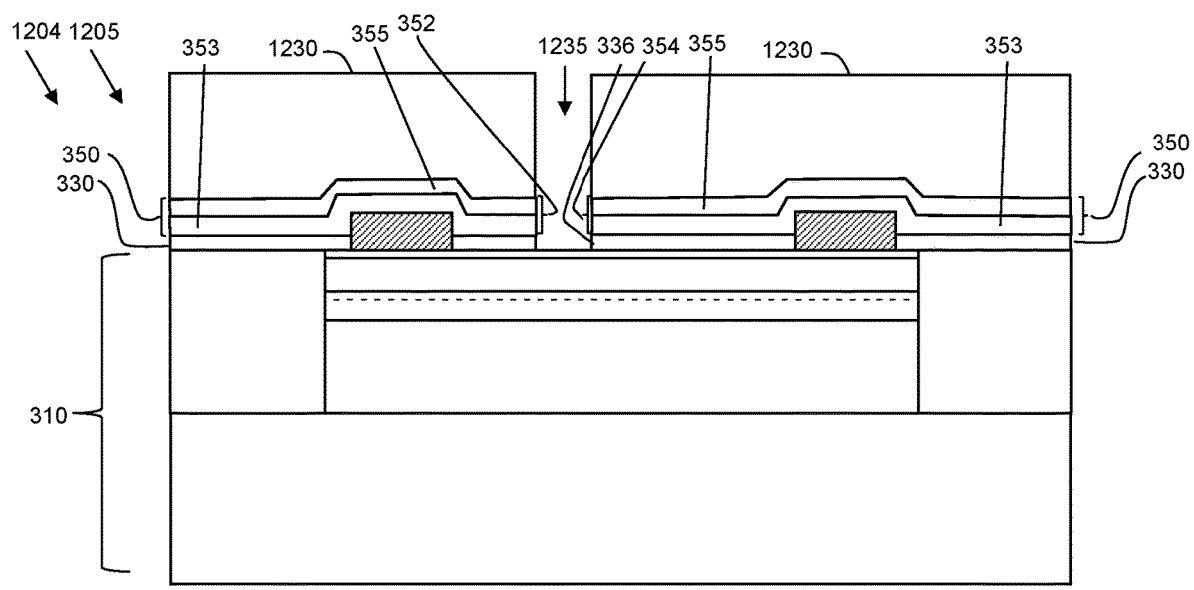

Referring again to block 612 and now to step 1204 in FIG. 12C, in an embodiment, patterning the second dielectric layer 350 of the semiconductor device 300 of FIG. 3 may include patterning a resist layer 1230 and forming an opening 1235 in an upper dielectric layer 355 and lower dielectric layer 353 of a second dielectric layer 350, and a first dielectric layer 330. In an embodiment, forming the opening 1235 results in the formation of the first dielectric edge 352, the second dielectric edge 354, formed in the protection layer 350 and the gate opening 336 formed in the first dielectric layer 330. Analogous to the etching of the first and second dielectric layers 130 and 150 described in conjunction with FIG. 12A, in an embodiment, the upper layer 355 may be etched with a wet or dry etch that selectively etches the upper dielectric layer 355 (e.g. SiN) and stops on the lower dielectric layer 353 (e.g. Al2O3, AlN, or other suitable etch stop dielectric material). Methods for etching the first dielectric layer 330 and the upper dielectric layer 355 and lower dielectric layer of second dielectric layer 330 are described in connection with steps 1200 and 1202 of FIGS. 12A and 12B, and for the sake of brevity, are not repeated here. Structure 1205 results.

Figure 12D:
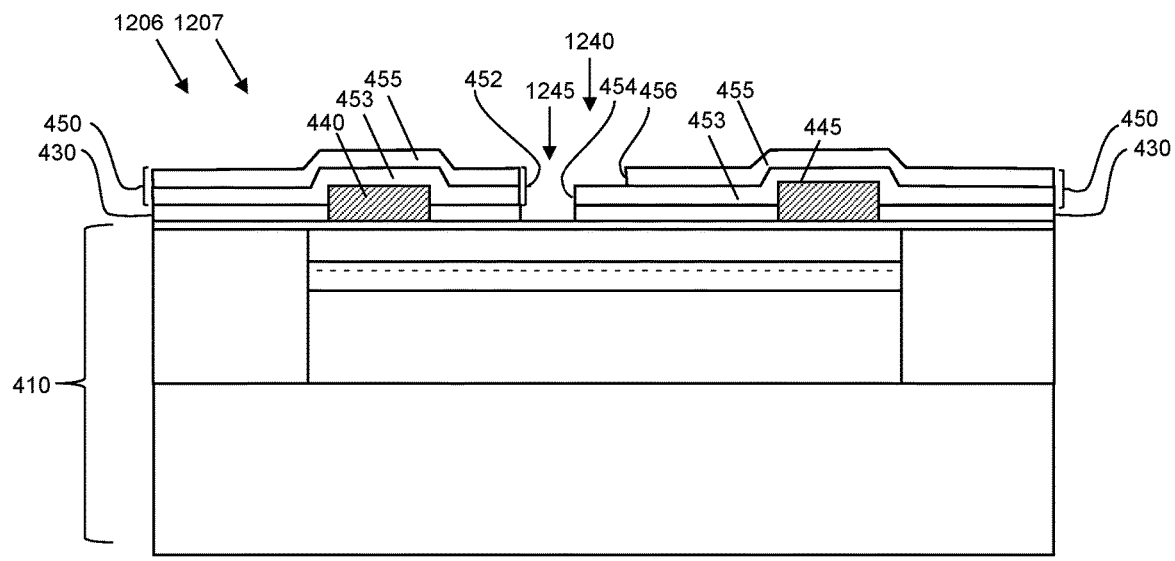

Referring again to block 612 and now to step 1206 in FIG. 12D, in an embodiment, patterning a second dielectric layer 450 of the semiconductor device 400 of FIG. 4 may include forming a first opening 1240 in an upper dielectric layer 455, a second opening 1245 in the lower dielectric layer 453 of the second dielectric layer 450, and a gate opening 436 in the first dielectric layer 430. Forming the openings 1240 and 1245 results in the gate opening 436 in the first dielectric layer 430 and the first edge 452, the second edge 454, and a third edge 455 in the dielectric layer 450. Analogous to the etching of the first and second dielectric layers 130 and 150 described in conjunction with FIG. 12A, in an embodiment, the upper layer 455 may be etched with a wet or dry etch that selectively etches the upper dielectric layer 455 (e.g. SiN), and stops on the lower dielectric layer 453 (e.g. Al2O3, AlN, or other suitable etch stop material). Methods for etching the first dielectric layer 430 and the upper dielectric layer 455 and lower dielectric layer of the second dielectric layer 450 are described in connection with steps 1200 and 1202 of FIGS. 12A and 12B, and for the sake of brevity, are not repeated here. Structure 1207 results.

Figure 12E:
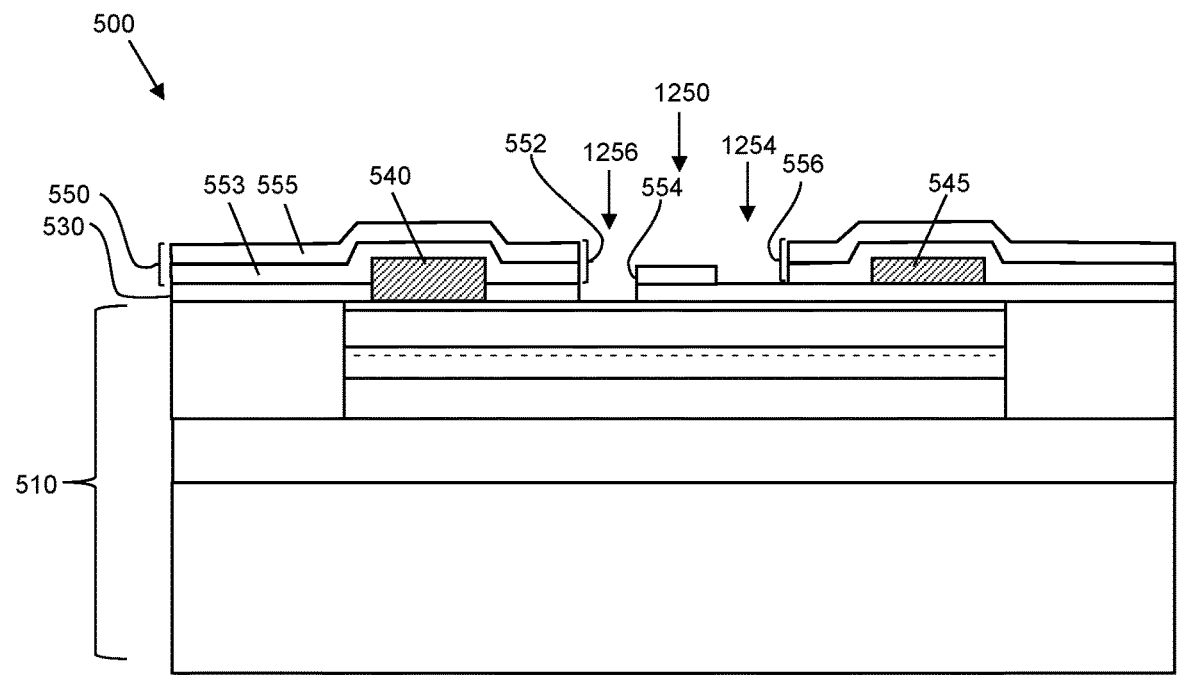

Referring again to block 612 and now to step 1208 in FIG. 12E, in an embodiment, patterning a second dielectric layer 550 of the semiconductor device 500 of FIG. 5 may include forming an opening 1250 in an upper dielectric layer 555, an opening 1254 in the upper and lower dialectic layers 553 and 555 of the second dielectric layer 550, and an opening 1256 in the first and second dielectric layers 530 and 550 that includes gate opening 536 in the first dielectric layer 530. According to an embodiment, patterning the second dielectric layer 550 may include forming a first opening 1250 in an upper dielectric layer 555 of the second dielectric layer 550. In an embodiment, forming a second opening 1254 creates a gap 1258 in the second dielectric layer 550, over the first dielectric layer 530. Analogous to the etching of the first and second dielectric layers 130 and 150 described in conjunction with FIG. 12A, in an embodiment, the upper layer 555 may be etched with a wet or dry etch that selectively etches the upper dielectric layer 555 (e.g. SiN) and stops on the lower dielectric layer 553 (e.g. Al2O3, AlN, or other suitable etch stop material). Methods for etching the first dielectric layer 530 and the upper dielectric layer 555 and lower dielectric layer 553 of the second dielectric layer 530 are described in connection with steps 1200 and 1202 of FIGS. 12A and 12B, and for the sake of brevity, are not repeated here. Structure 1209 results.

Referring to blocks 614 and 616 of FIG. 6 and step 1300-1308 of FIGS. 13A, 13B, 13C, 13D, and 13E, subsequent processing of GaN HFET devices 100, 200, 300, 400 and 500 of FIGS. 1, 2, 3, 4, and 5 is described according to an embodiment. In an embodiment, the method of fabrication may include forming gate electrodes 160, 260, 360, 460, and 560 for GaN HFET devices 100, 200, 300, 400 and 500, and completing the subsequent processing to finish GaN HFET devices 100, 200, 300, 400 and 500. Subsequent processing may include forming additional material layers such as additional dielectric layers and forming additional electrodes such as field plates or other electrodes, Referring now to step 1300 of FIG. 13A, in an embodiment, the gate electrode 160 may be formed using a "lift-off" technique wherein opening(s) for the gate are created in a resist layer (not shown) over the second dielectric layer 150 and gate opening 136 in second dielectric layer 150. A gate metal layer may be deposited (e.g. by evaporation) over the resist layer, the exposed first dielectric layer 230, and the opening 236. (Only the gate electrode 160. not metal deposited over the resist layer is shown). Solvents (e.g. acetone and/or resist strip) may be used to dissolve the resist layer and lift off the gate metal layer to form the gate electrode 160. GaN HFET device 100 results.

Referring now to step 1302 of FIG. 13B, in an embodiment, the gate electrode 260 may be formed using a "lift-off" technique wherein opening(s) for the gate are created in a resist layer 1220 of FIG. 12B over the second dielectric layer 150 and the gate opening 136 in first dielectric layer 230. A gate metal layer may be deposited over the resist layer, the exposed second dielectric layer 230, and the opening 236. Solvents may be used to dissolve the resist layer and lift off the gate metal layer to form the gate electrode 160. GaN HFET device 200 results.

Figure 13C:
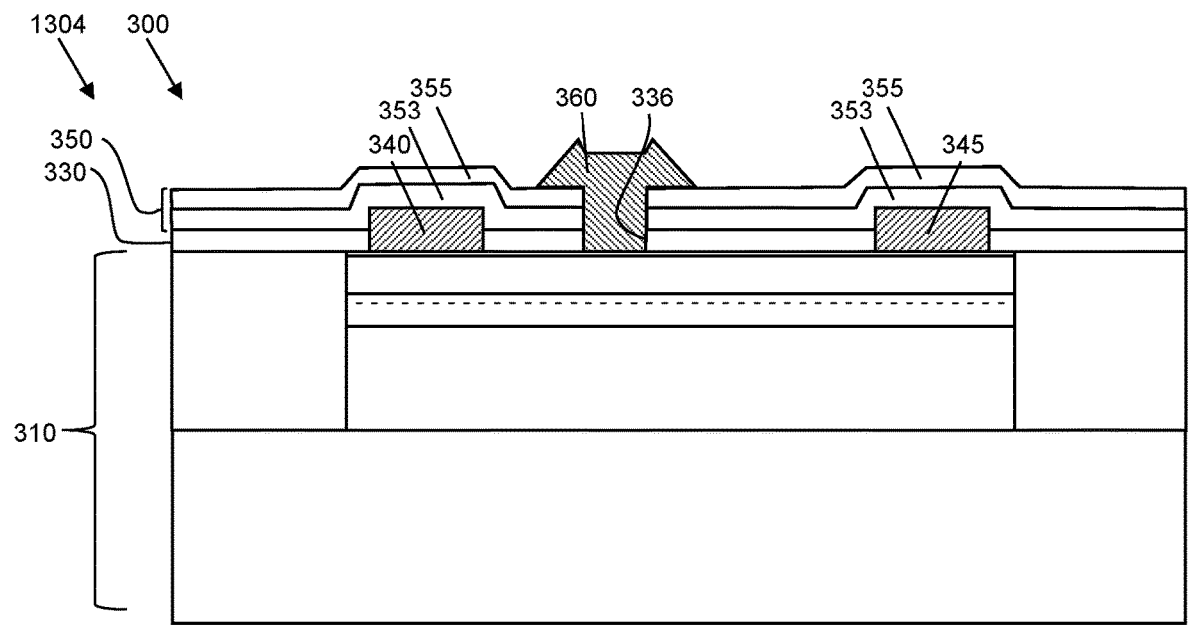

Referring now to step 1304 of FIG. 13C, in an embodiment, the gate electrode 360 may be formed using a "lift-off" technique wherein opening(s) for the gate are created in a resist layer (not shown) over the second dielectric layer 250 and the gate opening 336 in second dielectric layer 350. A gate metal layer may be deposited over the resist layer, the exposed second dielectric layer 250, and the opening 236. Solvents may be used to dissolve the resist layer and lift off the gate metal layer to form the gate electrode 360. GaN HFET device 300 results.

Figure 13D:
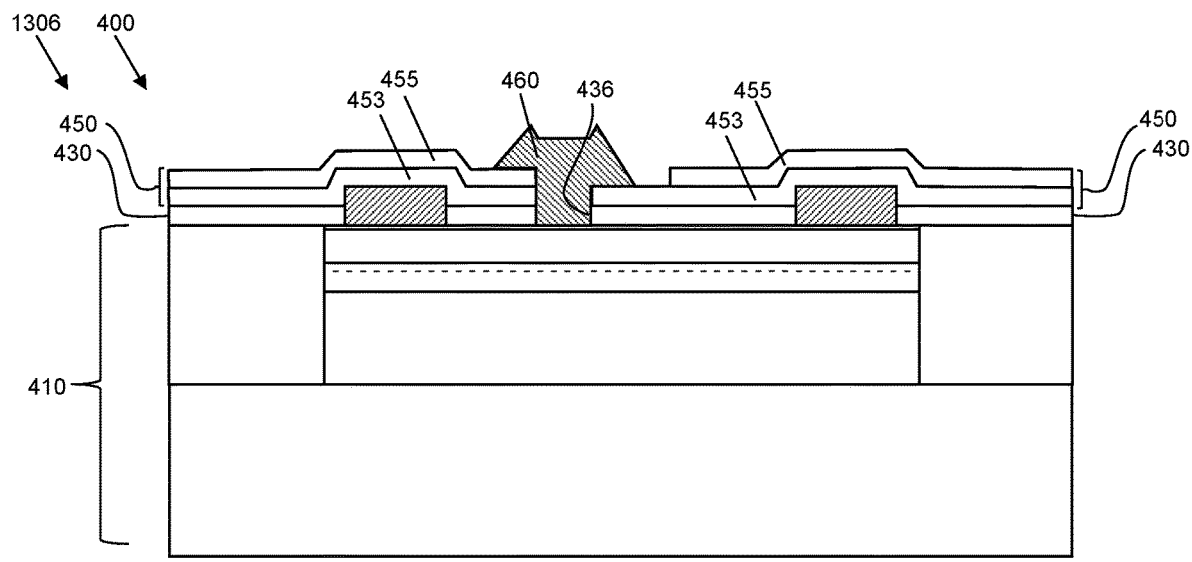

Referring now to step 1306 of FIG. 13D, in an embodiment, the gate electrode 460 may be formed using a "lift-off" technique wherein opening(s) for the gate are created in a resist layer (not shown) over the lower second dielectric layer 453, the upper second dielectric layer 455, and the gate opening 436 in first dielectric layer 430. A gate metal layer may be deposited over the resist layer, the lower second dielectric layer 453, the upper second dielectric layer 455, and the gate opening 436. Solvents may be used to dissolve the resist layer and lift off the gate metal layer to form the gate electrode 460. GaN HFET device 400 results.

Figure 13E:
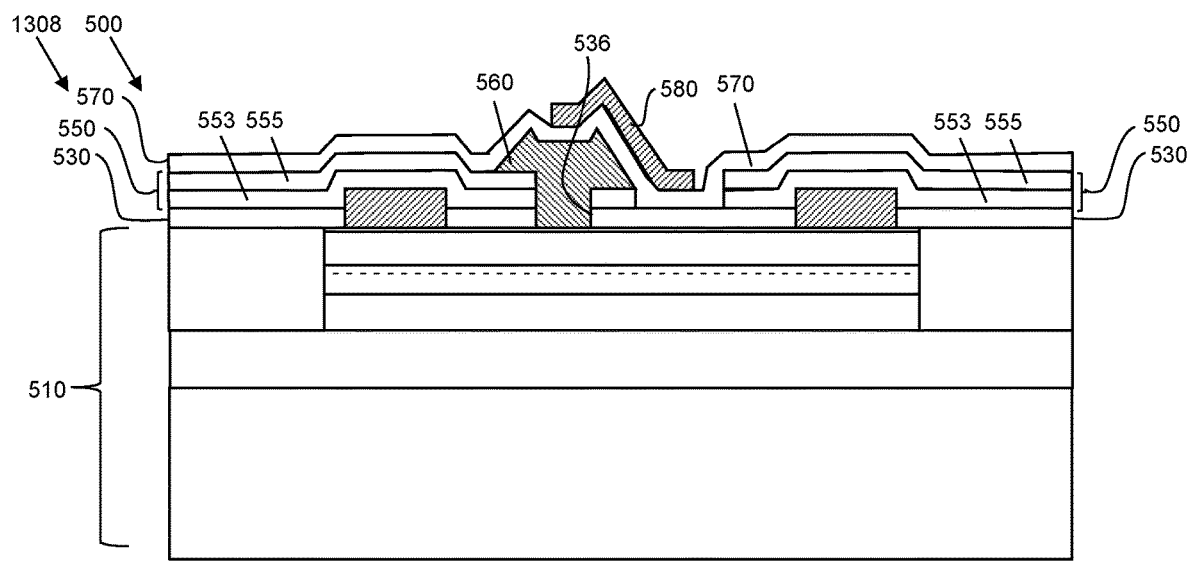

Referring now to step 1308 of FIG. 13E, in an embodiment, the gate electrode 560 may be formed using a "lift-off" technique wherein opening(s) for the gate are created in a resist layer (not shown) over the lower second dielectric layer 553, the upper second dielectric layer 555, and the gate opening 536 in first dielectric layer 530. A gate metal layer may be deposited over the resist layer, the lower second dielectric layer 553, the upper second dielectric layer 555, and the gate opening 536. Solvents (e.g. acetone and/or resist strip) may be used to dissolve the resist layer and lift off the gate metal layer to form the gate electrode 560. In an embodiment, a third dielectric layer 570 may be disposed over the second dielectric layer 450, the gate electrode 460 using techniques analogous to those used to form the second dielectric layer 450 and as described in connection with block 610 of FIG. 6 and step 1100-1102 of FIGS. 11A-11B. In an embodiment, a field plate 580 may be deposited over the third dielectric layer 570. GaN HFET device 500 results.

Various embodiments of a semiconductor device have been disclosed. According to an embodiment, a semiconductor device may include a semiconductor substrate that includes an upper surface and a channel, a first dielectric layer disposed over the upper surface of the semiconductor substrate, a source electrode and a drain electrode formed over the semiconductor substrate within openings formed in the first dielectric layer. The source electrode and drain electrodes may be electrically coupled to the channel, according to an embodiment. An embodiment may include a gate electrode formed over the semiconductor substrate between the source electrode and the drain electrode. In an embodiment, the gate electrode may be electrically coupled to the channel. An embodiment may include a protection layer disposed on the source electrode, the drain electrode, and the first dielectric layer. A first edge of the protection layer may terminate the protection layer between the source electrode and the gate electrode, according to an embodiment. In an embodiment, a second edge of the protection layer may terminate the protection layer between the gate electrode and the drain electrode. According to an embodiment, the protection layer includes on or more dielectric layers. In an embodiment, the first protection layer may be resistant to an etchant of at least one material used to form the source electrode and the drain electrode. The gate electrode may include a vertical stem disposed within a gate opening formed in the first dielectric layer, a first protruding region coupled to the vertical stem, and extending laterally over the first dielectric layer and toward the source electrode, terminating at a first gate edge; and a second protruding region coupled to the vertical stem and extending laterally over the first dielectric layer toward the drain electrode, and terminating at a second gate edge, according to an embodiment. In an embodiment, the first edge of the protection layer may terminate under the first protruding region. In another embodiment, the second edge of the protection layer may terminate under the second protruding region. The first edge of the protection layer may terminate under the first protruding region of the gate electrode and the second edge of the protection layer may terminate under the second protruding region of the gate electrode, according to an embodiment. In an embodiment, the first edge of the protection layer and the second edge of the protection layer may be self-aligned with the vertical stem of the gate electrode. In an embodiment, the first edge of the protection layer may be self-aligned with the first gate edge. The second protection layer edge may be self-aligned with the second gate edge, according to an embodiment. In an embodiment, the first edge of the protection layer may be self-aligned with the first gate edge and the second protection layer edge may be self-aligned with the second gate edge, according to an embodiment. In some embodiments, the first protection layer may include a lower dielectric layer and one or more upper dielectric layers. The lower dielectric layer may be selected from one or more materials selected fro, aluminum oxide, aluminum nitride, silicon nitride, silicon dioxide, and hafnium oxide, according to an embodiment. In an embodiment, the first edge of the protection layer may be formed in the lower dielectric layer, and an upper first edge of the protection layer may be formed in at least one of the one or more upper dielectric layers. In an embodiment, the first edge of the protection layer may be self-aligned with the vertical stem of the gate electrode, and the upper first edge of the protection layer is self-aligned with the first gate edge. The second protection layer edge may be formed in the lower dielectric layer, and a third edge may be formed in at least one of the one or more upper dielectric layers, according to an embodiment. In an embodiment, the second protection layer edge may be self-aligned with the vertical stem of the gate electrode, and the third edge may terminate between the second gate edge and the drain electrode.

In another embodiment, gallium nitride heterojunction field effect transistor may include a semiconductor substrate that includes an upper surface and a channel that includes GaN, a first dielectric layer disposed over the upper surface of the semiconductor substrate, a source electrode and a drain electrode formed over the semiconductor substrate within openings formed in the first dielectric layer. According to an embodiment, the source electrode and the drain electrode may be electrically coupled to the channel. In an embodiment, a gate electrode may be formed over the semiconductor substrate between the source electrode and the drain electrode, wherein the gate electrode is electrically coupled to the channel. In an embodiment, a protection layer that includes one or more dielectric layers, wherein the protection layer is resistant to an etchant of at least one material of the source electrode and drain electrode may be disposed over the source electrode, the drain electrode, and the first dielectric layer. A first edge of the protection layer of the protection layer may terminate between the source electrode and the gate electrode, and a second protection layer edge of the protection layer may terminate between the gate electrode and the drain electrode, according to an embodiment.

Still other embodiments of the inventive subject matter may include a method of fabricating a semiconductor device. An embodiment of the method may include disposing a first dielectric layer over the upper surface of a semiconductor substrate, forming openings in the first dielectric layer, wherein the openings expose the upper surface of the semiconductor substrate. An embodiment of the method may further include forming a source electrode and a drain electrode over the semiconductor substrate within the openings formed in the first dielectric layer, wherein the source electrode and the drain electrode may be coupled to the channel. An embodiment of the method may include forming a gate electrode over the semiconductor substrate, between the source electrode and the drain electrode and forming a protection layer that includes one or more dielectric layers and is resistant to an etchant of at least one material of the source electrode and drain electrode, wherein the protection layer is formed on the source electrode, the drain electrode, and the first dielectric layer. An embodiment of the method may also include patterning the protection layer to produce a first edge of the protection layer that terminates between the source electrode and the gate electrode, and a second edge of the protection layer that terminates between the gate electrode and the drain electrode. In an embodiment, forming the source electrode and the drain electrode may include annealing the source electrode and the drain electrode before forming the protection layer. In an embodiment, forming the source electrode and the drain electrode may include annealing the source electrode and the drain electrode after forming the protection layer. Forming the protection layer may include forming an upper dielectric layer and a lower dielectric layer, wherein the lower dielectric layer is wet-etchable and resistant to a dry etchant that is suitable for etching the upper dielectric layer, according to an embodiment.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road may for implementing the described embodiment or embodiments. It should be understood that various changes can be made in the function and arrangement of elements without departing from the scope defined by the claims, which includes known equivalents and foreseeable equivalents at the time of filing this patent application.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

What is claimed is:

1. A semiconductor device comprising:
a semiconductor substrate that includes an upper surface and a channel;

a first dielectric layer disposed over the upper surface of the semiconductor substrate;

a source electrode and a drain electrode formed over the semiconductor substrate within openings formed in the first dielectric layer, wherein the source electrode and drain electrode are electrically coupled to the channel;

a gate electrode formed over the semiconductor substrate between the source electrode and the drain electrode, wherein the gate electrode is electrically coupled to the channel, and wherein the gate electrode forms a Schottky contact to the semiconductor substrate; and a protection layer disposed on the source electrode, the drain electrode, and the first dielectric layer, wherein a first edge of the protection layer terminates the protection layer between the source electrode and the gate electrode, and a second edge of the protection layer terminates the protection layer between the gate electrode and the drain electrode.

2. The semiconductor device of claim 1, wherein the protection layer includes one or more dielectric layers.

3. The semiconductor device of claim 1, wherein the protection layer is resistant to an etchant of at least one material used to form the source electrode and the drain electrode.

4. The semiconductor device of claim 1, wherein the gate electrode comprises:
   a vertical stem disposed within a gate opening formed in the first dielectric layer;
   a first protruding region coupled to the vertical stem, and extending laterally over the first dielectric layer and toward the source electrode, terminating at a first gate edge; and
   a second protruding region coupled to the vertical stem and extending laterally over the first dielectric layer toward the drain electrode, and terminating at a second gate edge.

5. The semiconductor device of claim 4, wherein the first edge of the protection layer terminates under the first protruding region.

6. The semiconductor device of claim 4, wherein the second edge of the protection layer terminates under the second protruding region.

7. The semiconductor device of claim 4, wherein the first edge of the protection layer terminates under the first protruding region of the gate electrode and the second edge of the protection layer terminates under the second protruding region of the gate electrode.

8. The semiconductor device of claim 4, wherein the first edge of the protection layer and the second edge of the protection layer are self-aligned with the vertical stem of the gate electrode.

9. The semiconductor device of claim 4, wherein the protection layer includes a lower dielectric layer and one or more upper dielectric layers.

10. The semiconductor device of claim 9, wherein the lower dielectric layer is selected from one or more materials selected from aluminum oxide, aluminum nitride, silicon nitride, silicon dioxide, and hafnium oxide.

11. The semiconductor device of claim 9, wherein the first edge of the protection layer is formed in the lower dielectric layer, and an upper first edge of the protection layer is formed in at least one of the one or more upper dielectric layers.

12. The semiconductor device of claim 11, wherein the first edge of the protection layer is self-aligned with the vertical stem of the gate electrode, and the upper first edge of the protection layer is self-aligned with the first edge of the protection layer formed in the lower dielectric layer.

13. The semiconductor device of claim 9, wherein the second edge of the protection layer is formed in the lower dielectric layer, and a third edge is formed in at least one of the one or more upper dielectric layers.

14. A semiconductor device comprising:
   a semiconductor substrate that includes an upper surface and a channel;
   a first dielectric layer disposed over the upper surface of the semiconductor substrate;
   a source electrode and a drain electrode formed over the semiconductor substrate within openings formed in the first dielectric layer, wherein the source electrode and drain electrode are electrically coupled to the channel;
   a gate electrode formed over the semiconductor substrate between the source electrode and the drain electrode, wherein the gate electrode is electrically coupled to the channel;
   a protection layer disposed on the source electrode, the drain electrode, and the first dielectric layer, wherein a first edge of the protection layer terminates the protection layer between the source electrode and the gate electrode, and a second edge of the protection layer terminates the protection layer between the gate electrode and the drain electrode;
   a vertical stem disposed within a gate opening formed in the first dielectric layer;
   a first protruding region coupled to the vertical stem, and extending laterally over the first dielectric layer and toward the source electrode, terminating at a first gate edge, wherein the first edge of the protection layer is self-aligned with the first gate edge; and
a second protruding region coupled to the vertical stem and extending laterally over the first dielectric layer toward the drain electrode, and terminating at a second gate edge.

15. The semiconductor device of claim 14, wherein the first edge of the protection layer is self-aligned with the first gate edge and the second protection layer edge is self-aligned with the second gate edge.

16. A semiconductor device comprising:
   a semiconductor substrate that includes an upper surface and a channel;
   a first dielectric layer disposed over the upper surface of the semiconductor substrate;
   a source electrode and a drain electrode formed over the semiconductor substrate within openings formed in the first dielectric layer, wherein the source electrode and drain electrode are electrically coupled to the channel;
   a gate electrode formed over the semiconductor substrate between the source electrode and the drain electrode, wherein the gate electrode is electrically coupled to the channel;
   a protection layer disposed on the source electrode, the drain electrode, and the first dielectric layer, wherein a first edge of the protection layer terminates the protection layer between the source electrode and the gate electrode, and a second edge of the protection layer terminates the protection layer between the gate electrode and the drain electrode, wherein the second edge of the protection layer is formed in the lower dielectric layer, and a third edge is formed in at least one of the one or more upper dielectric layers;
   a vertical stem disposed within a gate opening formed in the first dielectric layer;

a first protruding region coupled to the vertical stem, and extending laterally over the first dielectric layer and toward the source electrode, terminating at a first gate edge; and a second protruding region coupled to the vertical stem and extending laterally over the first dielectric layer toward the drain electrode, and terminating at a second gate edge, wherein the second edge of the protection layer is self-aligned with the vertical stem of the gate electrode, and the third edge terminates between the second gate edge and the drain electrode.

17. A gallium nitride (GaN) heterojunction field effect transistor device comprising:
   a semiconductor substrate that includes an upper surface and a channel that includes gallium nitride;
   a first dielectric layer disposed over the upper surface of the semiconductor substrate;
   a source electrode and a drain electrode formed over the semiconductor substrate within openings formed in the first dielectric layer, wherein the source electrode and the drain electrode are electrically coupled to the channel;
   a gate electrode formed over the semiconductor substrate between the source electrode and the drain electrode, wherein the gate electrode is electrically coupled to the channel, and wherein the gate electrode forms a Schottky contact with the semiconductor substrate; and
   a protection layer that includes one or more dielectric layers, wherein the protection layer is resistant to an etchant of at least one material of the source electrode and drain electrode, wherein the protection layer is disposed over the source electrode, the drain electrode, and the first dielectric layer, wherein a first edge of the protection layer terminates between the source electrode and the gate electrode, and a second edge of the protection layer terminates between the gate electrode and the drain electrode.

18. A method of fabricating a semiconductor device, the method comprising:
   disposing a first dielectric layer over the upper surface of a semiconductor substrate;
   forming openings in the first dielectric layer, wherein the openings expose the upper surface of the semiconductor substrate;
   forming a source electrode and a drain electrode over the semiconductor substrate within the openings formed in the first dielectric layer, wherein the source electrode and the drain electrode are coupled to the channel;
   forming a gate electrode over the semiconductor substrate, between the source electrode and the drain electrode, wherein the gate electrode is in Schottky contact with the semiconductor substrate; and
   forming a protection layer that includes one or more dielectric layers and is resistant to an etchant of at least one material of the source electrode and drain electrode, wherein the protection layer is formed on the source electrode, the drain electrode, and the first dielectric layer; and
   patterning the protection layer to produce a first edge of the protection layer that terminates between the source electrode and the gate electrode, and a second edge of the protection layer that terminates between the gate electrode and the drain electrode.

19. The method of claim 18, wherein forming the source electrode and the drain electrode includes annealing the source electrode and the drain electrode before forming the protection layer.

20. The method of claim 18, wherein forming the source electrode and the drain electrode includes annealing the source electrode and the drain electrode after forming the protection layer.

21. A method of fabricating a semiconductor device, the method comprising:
   disposing a first dielectric layer over the upper surface of a semiconductor substrate;
   forming openings in the first dielectric layer, wherein the openings expose the upper surface of the semiconductor substrate;
   forming a source electrode and a drain electrode over the semiconductor substrate within the openings formed in the first dielectric layer, wherein the source electrode and the drain electrode are coupled to the channel;
   forming a gate electrode over the semiconductor substrate, between the source electrode and the drain electrode; and
   forming a protection layer that includes one or more dielectric layers and is resistant to an etchant of at least one material of the source electrode and drain electrode, wherein the protection layer is formed on the source electrode, the drain electrode, and the first dielectric layer, wherein forming the protection layer includes forming an upper dielectric layer and a lower dielectric layer, wherein the lower dielectric layer is wet-etchable and resistant to a dry etchant that is suitable for etching the upper dielectric layer; and
   patterning the protection layer to produce a first edge of the protection layer that terminates between the source electrode and the gate electrode, and a second edge of the protection layer that terminates between the gate electrode and the drain electrode.

* * * * *